(12) United States Patent
Guevenc et al.

(10) Patent No.: US 12,351,737 B2
(45) Date of Patent: Jul. 8, 2025

(54) CHEMICAL MECHANICAL POLISHING OF SUBSTRATES CONTAINING COPPER AND RUTHENIUM

(71) Applicant: BASF SE, Ludwigshafen am Rhein (DE)

(72) Inventors: Haci Osman Guevenc, Ludwigshafen am Rhein (DE); Michael Lauter, Ludwigshafen am Rhein (DE); Te Yu Wei, Taoyuan (TW); Wei Lan Chiu, Taipei (TW); Reza M. Golzarian, Portland, OR (US); Julian Proelss, Allschwil (CH); Leonardus Leunissen, Veldhoven (NL)

(73) Assignee: BASF SE, Ludwigshafen am Rhein (DE)

( * ) Notice: Subject to any disclaimer, the term of this patent is extended or adjusted under 35 U.S.C. 154(b) by 0 days.

(21) Appl. No.: 18/368,032

(22) Filed: Sep. 14, 2023

(65) Prior Publication Data

US 2023/0416570 A1 Dec. 28, 2023

Related U.S. Application Data

(62) Division of application No. 17/312,797, filed as application No. PCT/EP2019/084771 on Dec. 12, 2019, now abandoned.

(30) Foreign Application Priority Data

Dec. 12, 2018 (EP) .................... 18212027

(51) Int. Cl.
*C09G 1/02* (2006.01)
*C09K 3/14* (2006.01)
*H01L 21/321* (2006.01)

(52) U.S. Cl.
CPC .............. *C09G 1/02* (2013.01); *C09K 3/1463* (2013.01); *H01L 21/3212* (2013.01)

(58) Field of Classification Search
None
See application file for complete search history.

(56) References Cited

U.S. PATENT DOCUMENTS 5,230,833 A 7/1993 Romberger et al.
6,821,897 B2 * 11/2004 Schroeder ................ C23F 3/06
438/692

(Continued)

FOREIGN PATENT DOCUMENTS

JP 2001-144039 A 5/2001
JP 2006-502579 A 1/2006

(Continued)

OTHER PUBLICATIONS

European Search Report for EP Patent Application No. 18212027.9, Issued on Jul. 1, 2019, 3 pages.

(Continued)

*Primary Examiner* — Stephanie P Duclair
(74) *Attorney, Agent, or Firm* — Faegre Drinker Biddle & Reath LLP

(57) ABSTRACT

The presently claimed invention relates to a chemical-mechanical polishing (CMP) composition and chemical-mechanical polishing (CMP) methods. The presently claimed invention particularly relates to a composition and process for chemical-mechanical polishing of substrates containing copper and ruthenium, specifically, semiconductor substrates containing copper and ruthenium.

12 Claims, 1 Drawing Sheet

(56) References Cited

U.S. PATENT DOCUMENTS

| | | |
|---|---|---|
| 6,852,009 B2 | 2/2005 | Kawase et al. |
| 6,869,336 B1 | 3/2005 | Hardikar |
| 7,265,055 B2 | 9/2007 | Thompson et al. |
| 2003/0228763 A1 | 12/2003 | Schroeder et al. |
| 2006/0075688 A1* | 4/2006 | Takenouchi ......... C09K 3/1463 438/692 |
| 2008/0105652 A1 | 5/2008 | Brusic et al. |
| 2011/0318929 A1 | 12/2011 | Mishima et al. |
| 2013/0005149 A1 | 1/2013 | Li et al. |
| 2014/0011361 A1* | 1/2014 | Reichardt ........... H01L 21/3212 438/693 |
| 2016/0027663 A1 | 1/2016 | Wang et al. |
| 2018/0002571 A1 | 1/2018 | Stender et al. |

FOREIGN PATENT DOCUMENTS

| | | |
|---|---|---|
| JP | 2010-041029 A | 2/2010 |
| JP | 2015-528835 A | 10/2015 |
| JP | 2016-032109 A | 3/2016 |
| JP | 2018-019075 A | 2/2018 |
| WO | 2014/006526 A2 | 1/2014 |
| WO | 2017/108748 A2 | 6/2017 |
| WO | 2017/221660 A1 | 12/2017 |

OTHER PUBLICATIONS

International Preliminary Report on Patentability received for PCT Patent Application No. PCT/EP2019/084771, mailed on Jun. 24, 2021, 6 pages.

International Search Report and Written Opinion received for PCT Patent Application No. PCT/EP2019/084771, mailed on Mar. 11, 2020, 7 pages.

* cited by examiner

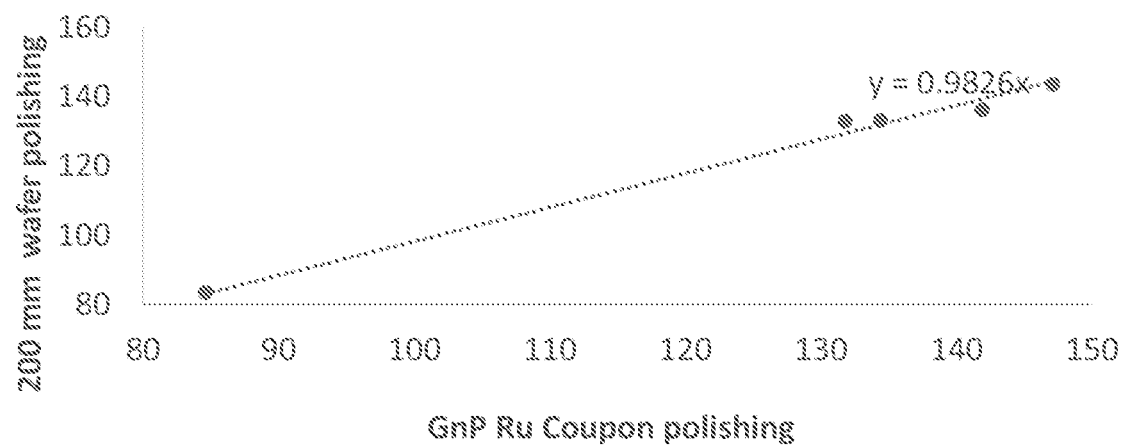

CHEMICAL MECHANICAL POLISHING OF SUBSTRATES CONTAINING COPPER AND RUTHENIUM

CROSS-REFERENCE TO RELATED APPLICATIONS

This application is a division of U.S. application Ser. No. 17/312,797, filed Jun. 10, 2021, which is a national stage application (under 35 U.S.C. § 371) of PCT/EP2019/084771, filed Dec. 12, 2019, which claims benefit of European Application No. 18212027.9, filed Dec. 12, 2018, all of which are incorporated herein by reference in their entirety.

TECHNICAL FIELD

The presently claimed invention relates to a chemical-mechanical polishing (CMP) composition and chemical-mechanical polishing (CMP) methods. The presently claimed invention particularly relates to a composition and process for chemical-mechanical polishing of substrates containing copper and ruthenium, specifically, semiconductor substrates containing copper and ruthenium.

BACKGROUND

In the semiconductor industry, chemical mechanical polishing (CMP) is a well-known technology applied in fabricating advanced photonic, microelectromechanical and microelectronic materials and devices, such as semiconductor wafers.

During the fabrication of materials and devices used in the semiconductor industry, CMP is employed to planarize surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

Tantalum (Ta) and Tantalum nitride (TaN) are conventionally used as barrier layer material to prevent device contamination caused by copper diffusing through the dielectric layer. However, it is difficult to deposit copper effectively onto the barrier layer due to the high resistivity of tantalum. Ruthenium (Ru) has been recently identified as a promising barrier layer material to replace the current tantalum barrier layer and the copper (Cu) seed layer.

The insolubility of copper in ruthenium makes ruthenium attractive as barrier layer material, and copper can also be directly deposited onto the ruthenium layer due to the lower resistivity of ruthenium.

In the state of the art, CMP processes in the presence of a CMP composition comprising a surfactant and an aromatic compound for chemical-mechanical polishing of substrates comprising copper and ruthenium are known and described, for instance, in the following references.

U.S. Pat. No. 6,869,336 B1 describes compositions for chemical-mechanical polishing using low contact pressures to remove ruthenium from substrates, the composition comprising a dispersing medium, abrasive particles and having pH in the range of 8 to 12.

U.S. Pat. No. 7,265,055 B2 describes a method for chemical-mechanical polishing a substrate comprising copper, ruthenium, tantalum, and dielectric layers. The method uses a polishing pad and a CMP composition or agent comprising alpha-alumina abrasive particles treated with negatively charged polymers or copolymers US 2008/0105652 A1 discloses a chemical mechanical polishing composition comprising an abrasive, an oxidizing agent, an amphiphilic non-ionic surfactant, calcium or magnesium ion, a corrosion inhibitor for copper and water, having pH in the range of about 6 to about 12.

US 2013/0005149 A1 discloses a chemical mechanical polishing composition comprising (a) at least one type of abrasive particles, (b) at least two oxidizing agents, (c) at least one pH adjusting agent, and (d) deionized water, (e) optionally comprising at least one antioxidant, and a method for the chemical-mechanical planarization of a substrate containing at least one copper layer, at least one ruthenium layer, and at least one tantalum layer.

U.S. Pat. No. 6,852,009 B2 discloses a polishing composition comprising silicon dioxide, at least one basic substance selected from the group consisting of an inorganic salt of an alkali metal, an ammonium salt, piperazine and ethylenediamine, at least one chelating agent and water. The basic substance is used for wafer polish to suppress metal contamination and diffusion into the wafers.

The methods and compositions disclosed in the prior art have limitations. In the methods and compositions for chemical mechanical polishing disclosed in the prior art, the polishing of metal like copper and ruthenium results in debris which might be either removed from the polishing environment by simple rinsing or by adsorption onto different surfaces such as wafer surfaces or the polishing pad surfaces. But both the cases are not desired in the CMP processes. Further, the adsorbed or accumulated debris on the polishing pad can generate defects on the wafer resulting in additional defects which are not desired. Therefore, there is a need for improving the CMP composition and methods for chemically-mechanically polishing of substrates containing copper (Cu), tantalum (Ta) and ruthenium (Ru).

Hence, it is an object of the presently claimed invention to provide improved CMP compositions and methods for chemically-mechanically polishing of substrates used in the semiconductor industry, particularly substrates comprising at least one copper (Cu) layer and/or at least one ruthenium (Ru) layer.

A further object of the presently claimed invention is to remove pad staining and particles from the wafer surface and polishing pad which are formed because of chemical-mechanical polishing of substrates used in the semiconductor industry.

SUMMARY

Surprisingly, it was found that the CMP compositions of the presently claimed invention as described hereinbelow provide a high material removal rate (MRR) of the substrate to be preferably polished and a clean pad polishing surface free of metal debris.

Accordingly, in one aspect of the presently claimed invention, a chemical-mechanical polishing (CMP) composition is provided comprising the following components:
- (A) at least one inorganic abrasive particle;
- (B) at least one chelating agent selected from carboxylic acids;
- (C) at least one corrosion inhibitor selected from unsubstituted or substituted triazoles;
- (D) at least one non-ionic surfactant comprising at least one polyoxyalkylene group;
- (E) at least one pad-cleaning agent selected from polymers and co-polymers of acrylic acid, methacrylic acid and maleic acid;
- (F) at least one carbonate or hydrogen carbonate;
- (G) at least one oxidizing agent selected from the group consisting of organic peroxides, inorganic peroxides, persulfates, iodates, periodic acids, periodates, permanganates, perchloric acids, perchlorates, bromic acids and bromates; and
- (H) an aqueous medium.

In another aspect, the presently claimed invention is directed to a method for the manufacture of semiconductor devices comprising the chemical-mechanical polishing of a substrate in the presence of the chemical-mechanical polishing (CMP) composition described hereinabove or hereinbelow.

In another aspect, the presently claimed invention is directed to a use of the chemical-mechanical polishing composition (CMP) for chemical-mechanical polishing of a substrate used in the semiconductor industry.

The presently claimed invention is associated with at least one of the following advantages:
(1) The CMP compositions and the CMP processes of the presently claimed invention for chemical-mechanical polishing of substrates used in the semiconductor industry, particularly substrates comprising copper (Cu), and/or tantalum (Ta), tantalum nitride (TaN), titanium (Ti), titanium nitride (TiN), ruthenium (Ru), cobalt (Co) or alloys thereof, show an improved polishing performance, especially
  - (i) a high material removal rate (MRR) of the substrate to be preferably polished, for example tantalum nitride,
  - (ii) a high material removal rate (MRR) of the substrate to be preferably polished, for example ruthenium,
  - (iii) a low material removal rate (MRR) of the substrate to be preferably polished, for example copper and/or low k material,
  - (iv) a clean pad polishing surface free of metal debris by addition of a pad-cleaning agent in the CMP composition.
  - (v) safe handling and reduction of hazardous by-products to a minimum, or
  - (vi) a combination of (i), (ii), (iii), (iv) and (v)
(2) The CMP composition of the presently claimed invention provides a stable formulation or dispersion, wherein no phase separation occurs.
(3) The CMP process of the presently claimed invention is easy to apply and requires as few steps as possible.

Other objects, advantages and applications of the presently claimed invention will become apparent to those skilled in the art from the following detailed description.

DETAILED DESCRIPTION

The following detailed description is merely exemplary in nature and is not intended to limit the presently claimed invention or the application and uses of the presently claimed invention. Furthermore, there is no intention to be bound by any theory presented in the preceding technical field, background, summary or the following detailed description.

The terms "comprising", "comprises" and "comprised of" as used herein are synonymous with "including", "includes" or "containing", "contains", and are inclusive or open-ended and do not exclude additional, non-recited members, elements or method steps. It will be appreciated that the terms "comprising", "comprises" and "comprised of" as used herein comprise the terms "consisting of", "consists" and "consists of".

Furthermore, the terms "(a)", "(b)", "(c)", "(d)" etc. and the like in the description and in the claims, are used for distinguishing between similar elements and not necessarily for describing a sequential or chronological order. It is to be understood that the terms so used are interchangeable under appropriate circumstances and that the embodiments of the presently claimed invention described herein are capable of operation in other sequences than described or illustrated herein. In case the terms "(A)", "(B)" and "(C)" or "(a)", "(b)", "(c)", "(d)", "(i)", "(ii)" etc. relate to steps of a method or use or assay there is no time or time interval coherence between the steps, that is, the steps may be carried out simultaneously or there may be time intervals of seconds, minutes, hours, days, weeks, months or even years between such steps, unless otherwise indicated in the application as set forth herein above or below.

In the following passages, different aspects of the presently claimed invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

Reference throughout this specification to "one embodiment" or "an embodiment" or "preferred embodiment" means that a particular feature, structure or characteristic described in connection with the embodiment is included in at least one embodiment of the presently claimed invention. Thus, appearances of the phrases "in one embodiment" or "in an embodiment" or "in a preferred embodiment" in various places throughout this specification are not necessarily all referring to the same embodiment but may refer. Furthermore, the features, structures or characteristics may be combined in any suitable manner, as would be apparent to a person skilled in the art from this disclosure, in one or more embodiments.

Furthermore, while some embodiments described herein include some, but not other features included in other embodiments, combinations of features of different embodiments are meant to be within the scope of the subject matter, and form different embodiments, as would be understood by those in the art. For example, in the appended claims, any of the claimed embodiments can be used in any combination.

Furthermore, the ranges defined throughout the specification include the end values as well, i.e. a range of 1 to 10 implies that both 1 and 10 are included in the range. For the avoidance of doubt, the applicant shall be entitled to any equivalents according to applicable law.

For the purposes of the presently claimed invention, '% by weight' or 'wt. %' as used in the presently claimed invention is with respect to the total weight of the coating composition. Further, sum of wt. % of all the compounds, as described hereinbelow, in the respective component adds up to 100 wt.-%.

For the purposes of the presently claimed invention, a corrosion inhibitor is defined as a chemical compound forming a protective molecular layer on the surface of a metal.

For the purposes of the presently claimed invention, a chelating agent is defined as a chemical compound that forms soluble, complex molecules with certain metal ions, inactivating the ions so that they cannot normally react with other elements or ions to produce precipitates or scale.

For the purposes of the presently claimed invention, a low-k material is a material having a k value (dielectric constant) of less than 3.5, preferably less than 3.0, more preferably less than 2.7. An ultra-low-k material Is a material having a k value (dielectric constant) of less than 2.4

For the purposes of the presently claimed invention, colloidal inorganic particles are inorganic particles which are produced by a wet precipitation process; and fumed inorganic particles are particles produced by high temperature flame hydrolysis of for example metal chloride precursor with hydrogen in the presence of oxygen, for example using the Aerosil® process.

For the purposes of the presently claimed invention, "colloidal silica" refers to silicon dioxide that has been prepared by condensation polymerization of Si(OH) 4. The precursor Si(OH) 4 can be obtained, for example, by hydrolysis of high purity alkoxysilanes, or by acidification of aqueous silicate solutions. Such colloidal silica can be prepared in accordance with U.S. Pat. No. 5,230,833 or can be obtained as any of various commercially available products, such as the Fuso® PL-1, PL-2, and PL-3 products, and the Nalco 1050, 2327 and 2329 products, as well as other similar products avail-able from DuPont, Bayer, Applied Research, Nissan Chemical, Nyacol and Clariant.

For the purposes of the presently claimed invention, the mean particle size is defined as the $d_{50}$ value of the particle size distribution of the inorganic abrasive particles (A) in the aqueous medium (H).

For the purposes of the presently claimed invention, the mean particle size is measured for example using dynamic light scattering (DLS) or static light scattering (SLS) methods. These and other methods are well known in the art, see e.g. Kuntzsch, Timo; Witnik, Ulrike; Hollatz, Michael Stintz; Ripperger, Siegfried; Characterization of Slurries Used for Chemical-Mechanical Polishing (CMP) in the Semiconductor Industry; Chem. Eng. Technol; 26 (2003), volume 12, page 1235.

For the purposes of the presently claimed invention, for dynamic light scattering (DLS), typically a Horiba LB-550 V (DLS, dynamic light scattering measurement) or any other such instrument is used. This technique measures the hydrodynamic diameter of the particles as they scatter a laser light source ($\lambda$=650 nm), detected at an angle of 90° or 173° to the incoming light. Variations in the intensity of the scattered light are due to the random Brownian motion of the particles as they move through the incident beam and are monitored as a function of time. Autocorrelation functions performed by the instrument as a function of delay time are used to extract decay constants; smaller particles move with higher velocity through the incident beam and correspond to faster decays.

For the purposes of the presently claimed invention, the decay constants are proportional to the diffusion coefficient, $D_t$, of the inorganic abrasive particle and are used to calculate particle size according to the Stokes-Einstein equation:

$$D_h = \frac{k_B T}{3\pi\eta D_t}$$

where the suspended particles are assumed to (1) have a spherical morphology and (2) be uniformly dispersed (i.e. not agglomerated) throughout the aqueous medium. This relationship is expected to hold true for particle dispersions that contain lower than 1% by weight of solids as there are no significant deviations in the viscosity of the aqueous dispersant, in which $\eta$=0.96 mPa·s (at T=22° C.). The particle size distribution of the fumed or colloidal inorganic particle dispersion is usually measured in a plastic cuvette at 0.1 to 1.0% solid concentration and dilution, if necessary, is carried out with the dispersion medium or ultra-pure water.

For the purposes of the presently claimed invention, the BET surface of the inorganic abrasive particles is determined according to DIN ISO 9277:2010-09.

For the purposes of the presently claimed invention, a surfactant is defined as a surface-active compound which decreases the surface tension of a liquid, the interfacial tension between two liquids, or that between a liquid and a solid.

For the purposes of the presently claimed invention, "water-soluble" means that the relevant component or ingredient of the composition can be dissolved in the aqueous phase on the molecular level.

For the purposes of the presently claimed invention, "water-dispersible" means that the relevant component or ingredient of the composition can be dispersed in the aqueous phase and forms a stable emulsion or suspension.

For the purposes of the presently claimed invention, an oxidizing agent is defined as a chemical compound which can oxidize the to-be-polished substrate or one of its layers.

For the purposes of the presently claimed invention, a pH adjusting agent is defined as a compound which is added to have its pH value adjusted to the required value.

For the purposes of the presently claimed invention, the measurement techniques disclosed are well known to a person skilled in the art and therefore do not limit the presently claimed invention.

Chemical mechanical polishing (CMP) composition (Q)

An aspect of the presently claimed invention, a chemical-mechanical polishing (CMP) composition (Q) is provided comprising the following components:
(A) at least one inorganic abrasive particle;
(B) at least one chelating agent selected from carboxylic acids;
(C) at least one corrosion inhibitor selected from unsubstituted or substituted triazoles;
(D) at least one non-ionic surfactant comprising at least one polyoxyalkylene group;
(E) at least one pad-cleaning agent selected from polymers and co-polymers of acrylic acid, methacrylic acid and maleic acid;
(F) at least one carbonate or hydrogen carbonate;
(G) at least one oxidizing agent selected from the group consisting of organic peroxides, inorganic peroxides, persulfates, iodates, periodic acids, periodates, permanganates, perchloric acids, perchlorates, bromic acids and bromates; and (H) an aqueous medium.

The CMP composition (Q) comprises the components (A), (B), (C), (D), (E), (F), (G), (H) and optionally further components as described below.

In an embodiment of the presently claimed invention, the at least one inorganic abrasive particle (A) is selected from the group consisting of a metal oxide, a metal nitride, a metal carbide, a silicide, a boride, a ceramic, a diamond, an organic/inorganic hybrid particle and silica.

For the purposes of the presently claimed invention, the chemical nature of at least one inorganic abrasive particle (A) is not particularly limited. (A) may be of the same chemical nature or a mixture of particles of different chemical nature. For the purposes of the presently claimed invention, particles (A) of the same chemical nature are preferred. The inorganic abrasive particles (A) are selected from the group consisting of a metal oxide, a metal nitride, a metal carbide, including a metalloid, a metalloid oxide or carbide, a silicide, a boride, a ceramic, a diamond, an organic/inorganic hybrid particle, silica, and any mixture of inorganic particles.

For the purposes of the presently claimed invention, the at least one inorganic abrasive particle (A) can be
- of one type of colloidal inorganic particles,
- of one type of fumed inorganic particles,
- a mixture of different types of colloidal and/or fumed inorganic particles.

For the purposes of the presently claimed invention, the at least one inorganic particle (A) is selected from the group consisting of colloidal or fumed inorganic particle or a mixture thereof. Among them, oxides and carbides of metals or metalloids are preferred. For the purposes of the presently claimed invention, the at least one inorganic particle (A) is preferably selected from the group consisting of alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. For the purposes of the presently claimed invention, the at least one inorganic particle (A) is more preferably selected from the group consisting of alumina, ceria, silica, titania, zirconia, or mixtures or composites thereof. (A) are silica particles. For the purposes of the presently claimed invention, the at least one inorganic particle (A) is most preferably colloidal silica particle.

In another embodiment of the presently claimed invention, the concentration of the at least one inorganic abrasive particle (A) is in the range of from ≥0.01 wt. % to ≤10 wt. % based on the total weight of the chemical-mechanical polishing composition.

For the purposes of the presently claimed invention, the concentration of the at least one inorganic abrasive particle (A) is not more than 10 wt. %, preferably not more than 5 wt. %, particularly not more than 3 wt. %, for example not more than 2 wt. %, most preferably not more than 1.8 wt. %, particularly not more than 1.5 wt. %, based on the total weight of the composition (Q). For the purposes of the presently claimed invention, the concentration of the at least one inorganic abrasive particle (A) is preferably at least 0.01 wt. %, more preferably at least 0.1 wt. %, most preferably at least 0.2 wt. %, particularly at least 0.3 wt. %, based on the total weight of the composition (Q). For the purposes of the presently claimed invention, the concentration of the at least one inorganic abrasive particle (A) is more preferably is in the range of from ≥0.4 wt. % to ≤1.2 wt. % based on the total weight of the CMP composition (Q)

For the purposes of the presently claimed invention, the at least one inorganic abrasive particle (A) can be contained in the CMP composition (Q) in various particle size distributions. The particle size distribution of the at least one inorganic abrasive particle (A) can be monomodal or multimodal. In case of multimodal particle size distribution, bimodal is often preferred. For the purposes of the presently claimed invention, a monomodal particle size distribution is preferred for the inorganic abrasive particles (A). The particle size distribution of the inorganic abrasive particles (A) is not particularly limited.

In a preferred embodiment of the presently claimed invention, the average particle diameter of the at least one inorganic abrasive particle (A) is in the range of ≥1 nm to ≤1000 nm determined according to dynamic light scattering technique.

The mean or average particle size of the at least one inorganic abrasive particle (A) can vary within a wide range. For the purposes of the presently claimed invention, the mean particle size of the at least one inorganic abrasive particle (A) is in the range of from ≥1 nm to ≤1000 nm, preferably in the range of from ≥10 nm to ≤400 nm, more preferably in the range of from ≥20 nm to ≤200 nm, more preferably in the range of from ≥25 nm to ≤180 nm, most preferably in the range of from ≥30 nm to ≤170 nm, particularly preferably in the range of from ≥40 nm to ≤160 nm, particularly most preferably in the range of from ≥45 nm to ≤150 nm, in each case measured with dynamic light scattering techniques using instruments for example a High Performance Particle Sizer (HPPS) from Malvern Instruments, Ltd. or Horiba LB550.

The BET surface of the at least one inorganic abrasive particle (A) can vary within a wide range. For the purposes of the presently claimed invention, the BET surface of the at least one inorganic abrasive particle (A) is in the range of from ≥1 $m^2/g$ to ≤500 $m^2/g$, more preferably in the range of from ≥5 $m^2/g$ to ≤250 $m^2/g$, most preferably in the range of from ≥10 $m^2/g$ to ≤100 $m^2/g$, particularly preferably in the range of from ≥20 $m^2/g$ to ≤95 $m^2/g$, particularly most preferably in the range of from ≥25 $m^2/g$ to ≤92 $m^2/g$, in each case determined according to DIN ISO 9277:2010-09.

For the purposes of the presently claimed invention, the at least one inorganic abrasive particle (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of agglomerates, cubes, cubes with bevelled edges, octahedrons, icosahedrons, cocoons, nodules or spheres with or without protrusions or indentations. For the purposes of the presently claimed invention, the inorganic abrasive particles (A) are preferably essentially spherical, whereby typically these have protrusions or indentations.

For the purposes of the presently claimed invention, the at least one inorganic abrasive particle (A) are preferably cocoon-shaped. The cocoons may be with or without protrusions or indentations. Cocoon-shaped particles are particles with a minor axis of from ≥10 nm to ≤ 200 nm, a ratio of major/minor axis of from ≥1.4 to ≤2.2, more preferably of from ≥1.6 to ≤ 2.0. Preferably they have an averaged shape factor of from ≥0.7 to ≤0.97, more preferably of from ≥0.77 to ≤0.92, preferably an averaged sphericity of from ≥0.4 to ≤0.9, more preferably of from ≥0.5 to ≤0.7 and preferably an averaged equivalent circle diameter of from ≥41 nm to ≤66 nm, more preferably of from ≥48 nm to ≤60 nm, in each case determined by transmission electron microscopy and scanning electron microscopy.

For the purposes of the presently claimed invention, the determination of the shape factor, the sphericity and the equivalent circle diameter of cocoon-shaped particles is explained hereinbelow. The shape factor gives information on the shape and the indentations of an individual particle and can be calculated according to the following formula:

shape factor=$4\pi$(area/perimeter2)

The shape factor of a spherical particle without indentations is 1. The value of shape factor decreases when the number of indentations increases. The sphericity gives information on the elongation of an individual particle using the moment about the mean and can be calculated according to the following formula wherein M are the centres of gravity of the respective particle:

sphericity=$(Mxx-Myy)-[4\ Mxy2+(Myy-Mxx)2]0.5/(Mxx-Myy)+[4\ Mxy2+(Myy-Mxx)2]0.5$ elongation=$(1/sphericity)0.5$ wherein $Mxx=\Sigma(x-xmean)^2/N$ $Myy=\Sigma(y-ymean)^2/N$ $Mxy=\Sigma[(x-xmean)*(y-ymean)]/N$ N number of pixels forming the image of the respective particle
x, y coordinates of the pixels
xmean mean value of the x coordinates of the N pixels forming the image of said particle
ymean mean value of the y coordinates of the N pixels forming the image of said particle The sphericity of a spherical particle is 1. The value of the sphericity decreases when particles are elongated. The equivalent circle diameter (also abbreviated as ECD in the following) of an individual non-circular particle gives information on the diameter of a circle which has the same area as the respective non-circular particle. The averaged shape factor, averaged sphericity and averaged ECD are the arithmetic averages of the respective property related to the analysed number of particles.

For the purposes of the presently claimed invention, the procedure for particle shape characterization is as follows. An aqueous cocoon-shaped silica particle dispersion with 20 wt. % solid content is dispersed on a carbon foil and is dried. The dried dispersion is analyzed by using Energy Filtered-Transmission Electron Microscopy (EF-TEM) (120 kilo volts) and Scanning Electron Microscopy secondary electron image (SEM-SE) (5 kilo volts). The EF-TEM image having a resolution of 2 k, 16 Bit, 0.6851 nm/pixel is used for the analysis. The images are binary coded using the threshold after noise suppression. Afterwards the particles are manually separated. Overlying and edge particles are discriminated and not used for the analysis. ECD, shape factor and sphericity as defined before are calculated and statistically classified.

For purposes of the presently claimed invention, representative examples of the cocoon-shaped particles include but is not limited to FUSOR PL-3 manufactured by Fuso Chemical Corporation having an average primary particle size (d1) of 35 nm and an average secondary particle size (d2) of 70 nm.

In a more preferred embodiment of the presently claimed invention, the at least one inorganic abrasive particle (A) is silica particle having an average primary particle size (d1) of 35 nm and an average secondary particle size (d2) of 70 nm.

In a most preferred embodiment of the presently claimed invention, the at least one inorganic abrasive particle (A) is colloidal silica particle having an average primary particle size (d1) of nm and an average secondary particle size (d2) of 70 nm.

In another most preferred embodiment of the presently claimed invention, the at least one inorganic abrasive particle (A) is cocoon-shaped silica particle having an average primary particle size (d1) of 35 nm and an average secondary particle size (d2) of 70 nm.

The CMP composition (Q) further comprises at least one chelating agent (B). The chelating agent (B) is different from the components (A), (C), (D), (E), (F) and (G).

For purposes of the presently claimed invention, the at least one chelating agent (B) is a carboxylic acid, more preferably, the at least one chelating agent (B) is a compound comprising at least two carboxylic acid (—COOH) or carboxylate (—COO—) groups.

In an embodiment of the presently claimed invention, the at least one chelating agent (B) is selected from the group consisting of dicarboxylic acids and tricarboxylic acids.

For the purposes of the presently claimed invention, the at least one chelating agent (B) is selected from the group consisting of malonic acid, tartaric acid, succinic acid, citric acid, acetic acid, adipic acid, malic acid, maleic acid, butyric acid, glutaric acid, glycolic acid, formic acid, lactic acid, lauric acid, malic acid, maleic acid, myristic acid, fumaric acid, palmitic acid, propionic acid, pyruvic acid, stearic acid, valeric acid, 2-methylburyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, propane-1,2,3-tricarboxylic acid, butane-1,2,3,4-tetracarboxylic acid, pentane-1,2,3,4,5-pentacarboxylic acid, trimellitic acid, trimesinic acid, pyromellitic acid, mellitic acid, and an oligomeric or polymeric polycarboxylic acid, and an aromatic compound comprising an acid group (Y).

In a preferred embodiment of the presently claimed invention, the at least one chelating agent (B) is selected from the group consisting of malonic acid, tartaric acid, succinic acid, adipic acid, malic acid, maleic acid, oxalic acid and fumaric acid.

In a more preferred embodiment of the presently claimed invention, the at least one chelating agent (B) is citric acid.

For the purposes of the presently claimed invention, the at least one chelating agent (B) is particularly preferably selected from the group consisting of malonic acid, citric acid, adipic acid, propane-1,2,3-tricarboxylic acid, butane-1,2,3,4-tetracarboxylic acid, and pentane-1,2,3,4,5-pentacarboxylic acid., and an aromatic compound comprising an acid group (Y). For the purposes of the presently claimed invention, the at least one chelating agent (B) is particularly preferably is a compound comprising at least three carboxylic acid (—COOH) or carboxylate (—COO—) groups.

For the purposes of the presently claimed invention, the at least one chelating agent (B) is particularly preferably selected from the group consisting of malonic acid, citric acid, and an aromatic compound comprising an acid group (Y). Particularly, (B) is an aromatic compound comprising an acid group (Y). The aromatic compound comprising an acid group (Y) is referred to as (B11) in the following. Representative examples include but are not limited to benzenecarboxylic acid comprising at least two carboxylic acid (—COOH) groups, or a salt thereof. For the purposes of the presently claimed invention, the at least one chelating agent (B) is particularly preferably a benzenedicarboxylic acid.

For the purposes of the presently claimed invention, the acid group (Y) is defined as being (Y) and its deprotonated form. The acid group (Y) comprised in the aromatic compound (B11) is preferably any acid group so that the pKa value (logarithmic measure of the acid dissociation constant) of the reaction H—(B11)⇌(B11)–+H+ or.
the reaction [H—(B11)]+⇌(B11)+H+.
is not more than 7, more preferably not more than 6, most preferably not more than 5.5, particularly preferably not more than 5, as measured in de-ionized water at 25° C. and atmospheric pressure.

For the purposes of the presently claimed invention, the acid group (Y) is preferably directly covalently bound to the aromatic ring system of the aromatic compound (B11).

Preferably, the aromatic compound (B11) comprises per aromatic ring at least two acid groups (Y).

The aromatic compound (B11) comprises at least one, preferably at least two, most preferably 2 to 6, particularly preferably 2 to 4, for example 2 acid groups (Y). The aromatic compound (B11) preferably comprises-per aromatic ring—at least one, more preferably at least two, most preferably 2 to 4, for example 2 acid groups (Y).

In a preferred embodiment, the aromatic compound (B11) comprises at least one benzene ring, and (B11) preferably comprises-per benzene ring—at least one, more preferably at least two, most preferably 2 to 4, for example 2 acid groups (Y).

In a further preferred embodiment of the presently claimed invention, the aromatic compound (B11) comprises at least one benzene ring, and (B11) preferably comprises-per benzene ring—at least one, more preferably at least two, most preferably 2 to 4, for example 2 carboxylic acid (—COOH) groups or their deprotonated form.

In another preferred embodiment of the presently claimed invention, the aromatic compound (B11) is a benzenecarboxylic acid comprising at least one, more preferably at least two, most preferably 2 to 4, for example 2 carboxylic acid (—COOH) groups, or a salt thereof.

In a further preferred embodiment of the presently claimed invention, the aromatic compound (B11) is a benzenecarboxylic acid comprising at least one, more preferably at least two, most preferably 2 to 4, for example 2 carboxylic acid (—COOH) groups which are directly covalently bound to the benzene ring, or a salt thereof.

In another preferred embodiment of the presently claimed invention, the aromatic compound (B11) is most preferably phthalic acid, terephthalic acid, isophthalic acid, 5-hydroxy-isophthalic acid, benzene-1,2,3-tricarboxylic acid, benzene-1,2,3,4-tetracarboxylic acid, or a derivative thereof, or a salt thereof, particularly terephthalic acid, isophthalic acid, 5-hydroxy-isophthalic acid, benzene-1,2,3,4-tetracarboxylic acid, or a derivative thereof, or a salt thereof, for example terephthalic acid, isophthalic acid, or 5-hydroxy-isophthalic acid.

In an embodiment of the presently claimed invention, the at least one chelating agent (B) is present in an amount in the range of from ≥0.001 wt. % to ≤2.5 wt. % based on the total weight of the chemical-mechanical polishing composition (Q).

For the purposes of the presently claimed invention, the chelating agent (B) is preferably not more than 2.5 wt. %, preferably not more than 1 wt. %, based on the total weight of the CMP composition (Q). For the purposes of the presently claimed invention, the amount of (B) is preferably at least 0.001 wt. %, more preferably at least 0.01 wt. %, most preferably at least 0.07 wt. %, based on the total weight of the CMP composition (Q).

The CMP composition (Q) further comprises at least one corrosion inhibitor (C). The corrosion inhibitor (C) is different from the components (A), (B), (D), (E), (F) and (G).

For the purposes of the presently claimed invention, the at least one corrosion inhibitors (C) is a triazole.

In an embodiment of the presently claimed invention, the at least one corrosion-inhibitor (C) triazole is selected from the group consisting of unsubstituted benzotriazole, substituted benzotriazoles, unsubstituted 1,2,3-triazole, substituted 1,2,3-triazoles, unsubstituted 1,2,4-triazole and substituted 1,2,4-triazoles.

In a preferred embodiment of the presently claimed invention, the at least one corrosion-inhibitor (C) is a substituted benzotriazole which is selected from the group consisting of 4-methyl benzotriazole, 5-methyl benzotriazole, 5,6-dimethyl-benzotriazole, 5-chloro-benzotriazole, 1-octanyl benzotriazole, carboxy-benzotriazole, butyl-benzotriazole, 6-ethyl-1H-1,2,4 benzotriazole, (1-pyrrolidinyl methyl) benzotriazole, 1-n-butyl-benzotriazole, benzotriazole-5-carboxylic acid, 4,5,6,7-tetrahydro-1H-benzotriazole, tolyltriazole, 5-bromo-1H-benzotriazole, 5-tert-butyl-1·H-benzotriazole, 5-(benzoyl)-1H-benzotriazole, 5,6-dibromo-1H-benzotriazole and 5-sec-butyl-1H-benzotriazole.

In an embodiment of the presently claimed invention, the corrosion-inhibitor (C) is present in an amount in the range of ≥0.001 wt. % to ≤1 wt. % based on the total weight of the chemical-mechanical polishing composition.

For the purposes of the presently claimed invention, the at least one corrosion inhibitor (C) is preferably present in an amount of not more than 10 wt. %, more preferably not more than 2 wt. %, most preferably not more than 1 wt. %, most preferably not more than 0.5 wt. %, particularly not more than 0.15 wt. %, for example not more than 0.08 wt. %, based on the total weight of the CMP composition (Q). The amount of (C) is preferably at least 0.0001 wt. %, more preferably at least 0.001 wt. %, most preferably at least 0.005 wt. %, particularly at least 0.02 wt. %, for example at least 0.04 wt. %, based on the total weight of the CMP composition (Q)

The CMP composition (Q) further comprises at least one non-ionic surfactant (D). The non-ionic surfactant (D) is different from the components (A), (B), (C), (E), (F) and (G).

For the purposes of the presently claimed invention, the at least one non-ionic surfactant (D) is preferably water-soluble and/or water-dispersible, more preferably water-soluble.

In an embodiment of the presently claimed invention, the at least one non-ionic surfactant (D) comprises a polyoxyalkylene group.

For the purposes of the presently claimed invention, the at least one non-ionic surfactant (D) is preferably an amphiphilic non-ionic surfactant, i.e. a surfactant which comprises at least one hydrophobic group (b1) and at least one hydrophilic group (b2). The non-ionic surfactant (D) can comprise more than one hydrophobic group (b1), e.g., 2, 3 or more groups (b1), which are separated from each other by at least one hydrophilic group (b2) as described hereinbelow. The non-ionic surfactant (D) can comprise more than one hydrophilic group (b2), e.g., 2, 3 or more groups (b2) which are separated from each other by hydrophobic groups (b1) as described hereinbelow.

For the purposes of the presently claimed invention, the at least one non-ionic surfactant (D) can have different block like general structures. Representative examples of block like structures include but are not limited to the following:
b1-b2,
b1-b2-b1,
b2-b1-b2,
b2-b1-b2-b1,
b1-b2-b1-b2-b1, and
b2-b1-b2-b1-b2.

The hydrophobic group (b1) is preferably an alkyl group, more preferably an alkyl group having 4 to 40, most preferably 5 to 20, particularly preferably 7 to 18, in particular 10 to 16, for example 11 to 14 carbon atoms.

The hydrophilic group (b2) is preferably a polyoxyalkylene group. The polyoxyalkylene group can be oligomeric or polymeric. More preferably, the hydrophilic group (b2) is selected polyoxyalkylene groups comprising.
(b21) oxyalkylene monomer units, and
(b22) oxyalkylene monomer units other than oxyethylene monomer units,
the monomer units (b21) is not identical to monomer units (b22), and the polyoxyalkylene group of (b2) containing the monomer units (b21) and (b22) in random, alternating, gradient and/or block-like distribution.

Most preferably, the hydrophilic group (b2) is selected from polyoxyalkylene groups comprising
(b21) oxyethylene monomer units, and
(b22) oxyalkylene monomer units other than oxyethylene monomer units,
the polyoxyalkylene group of (b2) containing the monomer units (b21) and (b22) in random, alternating, gradient and/or block-like distribution.

For the purposes of the presently claimed invention, the oxyalkylene monomer units other than oxyethylene monomer units (b22) preferably are substituted oxyalkylene monomer units wherein the substituents are selected from the group consisting of alkyl, cycloalkyl, aryl, alkyl-cycloalkyl, alkyl-aryl, cycloalkyl-aryl and alkyl-cycloalkyl-aryl groups.

The oxyalkylene monomer units other than oxyethylene monomer units (b22) are
more preferably derived from substituted oxiranes (X) wherein the substituents are selected from the group consisting of alkyl, cycloalkyl, aryl, alkyl-cycloalkyl, alkyl-aryl, cycloalkyl-aryl and alkyl-cycloalkyl-aryl groups,
most preferably derived from alkyl-substituted oxiranes (X),
particularly preferably derived from substituted oxiranes (X) wherein the substituents are selected from the group consisting of alkyl groups having 1 to 10 carbon atoms,
for example, derived from methyl oxirane (propyleneoxide) and/or ethyl oxirane (butylene oxide).

For the purposes of the presently claimed invention, the substituents of the substituted oxiranes (X) themselves can also carry inert substituents, i.e., the substituents which do not adversely affect the copolymerization of the oxiranes (X) and the surface activity of the non-ionic surfactants (D). Examples of such inert substituents include but are not limited to fluorine and chlorine atoms, nitro groups and nitrile groups. The inert substituents if present, are present in amounts that they do not adversely affect the hydrophilic-hydrophobic balance of the non-ionic surfactant (D). For the purposes of the presently claimed invention, the substituents of the substituted oxiranes (X) preferably do not carry inert substituents.

For the purposes of the presently claimed invention, the substituents of the substituted oxiranes (X) are preferably selected from the group consisting of alkyl groups having 1 to 10 carbon atoms, cycloalkyl groups having 5 to 10 carbon atoms in spirocyclic, exocyclic and/or annealed configuration, aryl groups having 6 to 10 carbon atoms, alkyl-cycloalkyl groups having 6 to 20 carbon atoms, alkyl-aryl groups having 7 to 20 carbon atoms, cycloalkyl-aryl group 11 to 20 carbon atoms, and alkyl-cycloalkyl-aryl groups having 12 to 30 carbon atoms. For the purposes of the presently claimed invention, the substituents of the substituted oxiranes (X) are more preferably selected from the group consisting of alkyl groups having 1 to 10 carbon atoms, the substituents of the substituted oxiranes (X) are particularly preferably selected from the group consisting of alkyl groups having 1 to 6 carbon atoms.

Representative examples of the most preferred substituted oxiranes (X) include but are not limited to methyl oxirane (propyleneoxide) and/or ethyl oxirane (butylene oxide), particularly methyl oxirane.

In a preferred embodiment of the presently claimed invention, the hydrophilic group (b2) preferably consists of the monomer units (b21) and (b22). The hydrophilic group (b2) is preferably a polyoxyethylene, polyoxypropylene or polyoxybutylene group, more preferably a polyoxyethylene group.

In the embodiments where the hydrophilic group (b2) comprises or consists of the monomer units (b21) and (b22), the polyoxyalkylene group acting as hydrophilic group (b2) consists the monomer units (b21) and (b22) in random, alternating, gradient and/or block like distribution. For example, the hydrophilic group (b2) can have only one type of distribution:
random: . . . b21-b21-b22-b21-b22-b22-b22-b21-b22 . . . ;
alternating: . . . b21-b22-b21-b22-b21 . . . ;
gradient: . . . b21-b21-b21-b22-b21-b21-b22-b22-b21-b22-b22-b22 . . . ; or
block like: . . . b21-b21-b21-b21-b22-b22-b22-b22 . . .

In another preferred embodiment of the presently claimed invention, the hydrophilic group (b2) consists of at least two types of distributions, e.g., an oligomeric or polymeric segment having a random distribution and an oligomeric or polymeric segment having alternating distribution. Preferably, the hydrophilic group (b2) has only one type of distribution, and most preferably, the distribution is random or block like.

In the embodiments where the hydrophilic group (b2) comprises or consists of the monomer units (b21) and (b22), the molar ratio of (b21) to (b22) can vary broadly and, therefore, can be adjusted most advantageously to the particular requirements of the composition, the process and the use of the presently claimed invention. For the purposes of the presently claimed invention, the molar ratio (b21):(b22) is preferably from 100:1 to 1:1, more preferably, from 60:1 to 1.5:1 and, most preferably, from 50:1 to 1.5:1, and particularly preferably, from 25:1 to 1.5:1, and particularly, from 15:1 to 2:1, and for example, from 9:1 to 2:1.

Also, the degree of polymerization of the oligomeric and polymeric polyoxyalkylene groups acting as hydrophilic groups (b2) can vary broadly and, therefore, can be adjusted most advantageously to the particular requirements of the composition, the process and the use of the presently claimed invention. For the purposes of the presently claimed invention, the degree of polymerization is preferably in the range of from 5 to 100, preferably 5 to 90, and most preferably, 5 to 80.

For the purposes of the presently claimed invention, the at least one non-ionic surfactant (D) is particularly preferably an amphiphilic non-ionic polyoxyethylene-polyoxypropylene alkyl ether surfactant which is a mixture of molecules containing, on the average, an alkyl group having 10 to 16 carbon atoms and 5 to 20 oxyethylene monomer units (b21) and 2 to 8 oxypropylene monomer units in random distribution. For example, the at least one non-ionic surfactant (D) is an amphiphilic non-ionic polyoxyethylene-polyoxypropylene alkyl ether surfactant which is a mixture of molecules containing, on the average, an alkyl group having 11 to 14 carbon atoms and 12 to 20 oxyethylene monomer units and 3 to 5 oxypropylene monomer units in random distribution.

In an embodiment of the presently claimed invention, the at least one non-ionic surfactant (D) is present in an amount in the range of ≥0.01 wt. % to ≤10 wt. % based on the total weight of the CMP composition (Q).

For the purposes of the presently claimed invention, the amount of the at least one non-ionic surfactant (D) is not more than 10 wt. %, more preferably not more than 3 wt. %, most preferably not more than 1 wt. %, particularly preferably not more than 0.5 wt. %, particularly not more than 0.1 wt. %, for example not more than 0.05 wt. %, based on the total weight of the CMP composition (Q). For the purposes of the presently claimed invention, the amount of the at least one non-ionic surfactant (D) is at least 0.00001 wt. %, more preferably at least 0.0001 wt. %, most preferably at least 0.0008 wt. %, particularly preferably at least 0.002 wt. %, particularly at least 0.005 wt. %, for example at least 0.008 wt. %, based on the total weight of the CMP composition (Q).

For the purposes of the presently claimed invention, the at least one non-ionic surfactant (D) has number average molecular weight in the range of ≥1500 g/mol to ≤400 g/mol, preferably in the range of ≥1000 g/mol to ≤500 g/mol, most preferably in the range of ≥900 g/mol to ≤ 600 g/mol, in each case determined by gel permeation chromatography (abbreviated as "GPC" in the following).

The CMP composition (Q) further comprises at least one pad-cleaning agent (E). The pad-cleaning agent (E) is different from the components (A), (B), (C), (D), (F) and (G).

In an embodiment of the presently claimed invention, at least one pad-cleaning agent (E) is selected from polymers and co-polymers of acrylic acid, methacrylic acid and maleic acid. In an embodiment of the presently claimed invention, the polymers and co-polymers of acrylic acid, methacrylic acid and maleic acid have a number average molecular weight in the range of ≥500 g/mol to ≤10000 g/mol determined according to gel permeation chromatography at 40° C. In a preferred embodiment of the presently claimed invention, the polymers and co-polymers of acrylic acid, methacrylic acid and maleic acid have a number average molecular weight in the range of ≥1000 g/mol to ≤7500 g/mol determined according to gel permeation chromatography at 40° C.

In a preferred embodiment of the presently claimed invention, at least one pad-cleaning agent (E) is selected from copolymer of acrylic, copolymer of methacrylic acid and copolymer of maleic acid.

In a preferred embodiment of the presently claimed invention, at least one pad-cleaning agent (E) is selected from copolymer of poly acrylic acid, poly methacrylic acid, acrylic acid and methacrylic acid.

In yet another preferred embodiment of the presently claimed invention, at least one pad-cleaning agent (E) is selected from polymers of acrylic acid, methacrylic acid and maleic acid.

In another preferred embodiment of the presently claimed invention, at least one pad-cleaning agent (E) is selected from poly (acrylic acid-co-maleic acid) copolymers.

In an embodiment of the presently claimed invention, the concentration of the at least one pad-cleaning agent (E) is in the range of ≥0.001 wt. % to ≤1 wt. % based on the total weight of the CMP composition (Q).

For the purposes of the presently claimed invention, the concentration of the at least one pad-cleaning agent is preferably not more than 5 wt. %, more preferably not more than 1 wt. %, more preferably not more than 0.5 wt. %, most preferably not more than 0.1 wt. %, based on the total weight of the CMP composition (Q). For the purposes of the presently claimed invention, the concentration of the at least one pad-cleaning agent is preferably at least at least 0.0001 wt. %, more preferably at least 0.001 wt. %, most preferably at least 0.005 wt. %, in particularly preferably at least 0.05 wt. %, more particularly preferably at least 0.01 wt. % based on the total weight of the CMP composition (Q).

The CMP composition (Q) further comprises at least one carbonate or hydrogen carbonate (F). For the purposes of the presently claimed invention, the carbonate comprises at least one $CO_3^{2-}$ anion, and a hydrogen carbonate comprises at least one $HCO_3^{-}$ anion.

For the purposes of the presently claimed invention, the carbonate or hydrogen carbonate salt (F) preferably do not comprise any anions other than $CO_3^{2-}$ or $HCO_3^{-}$ anion. In an embodiment of the presently claimed invention, the CMP composition (Q) further comprises at least one carbonate. The at least one carbonate preferably do not comprise any anions other than the $CO_3^{2-}$ anion.

For the purposes of the presently claimed invention, the at least one carbonate or hydrogen carbonate (F) comprises at least one cation selected from the group consisting of $NH_4^+$ cation, organic ammonium cations, N-heterocyclic cations, alkali metal, and earth alkali metal cation. More preferably, (F) comprises at least one $NH_4^+$, alkali metal or earth alkali metal cation. Most preferably, (F) comprises at least one alkali metal cation. Particularly preferably, (F) is an alkali carbonate or an alkali hydrogen carbonate. Particularly more preferably, (F) comprises at least one sodium or potassium cation. Particularly most preferably, (F) comprises at least one potassium cation. Particularly, (F) is potassium carbonate or potassium hydrogen carbonate. For example, (F) is potassium carbonate.

An organic ammonium cation is any cation of the formula $[NR_{11}R_{12}R_{13}R_{14}]+$, wherein $R_{11}$, $R_{12}$, $R_{13}$ is-independently from each other—H, alkyl, aryl, alkylaryl, or arylalkyl, and $R_{14}$ is alkyl, aryl, alkylaryl, or arylalkyl.

In an embodiment of the presently claimed invention, the concentration of the at least one carbonate or hydrogen carbonate is in the range of from ≥0.001 wt. % to ≤1 wt. %.

For the purposes of the presently claimed invention, the concentration of the at least one carbonate or hydrogen carbonate is not more than 10 wt. %, more preferably not more than 5 wt. %, most preferably not more than 3 wt. %, particularly preferably not more than 2 wt. %, particularly not more than 1 wt. %, for example not more than 0.7 wt. %, based on the total weight of the CMP composition (Q). For the purposes of the presently claimed invention, the concentration of the at least one carbonate or hydrogen carbonate is at least 0.001 wt. %, more preferably at least 0.01 wt. %, most preferably at least 0.05 wt. %, particularly preferably at least 0.1 wt. %, particularly at least 0.2 wt. %, based on the total weight of the CMP composition (Q).

The CMP composition (Q) of the presently claimed invention further comprises at least one oxidizing agent (G). The at least one oxidizing agent (G) is different from the components (A), (B), (C), (D), (E) and (F).

In an embodiment of the presently claimed invention, the at least one oxidizing agent (G) is selected from the group consisting of organic peroxides, inorganic peroxides, persulfates, iodates, periodic acids, periodates, permanganates, perchloric acids, perchlorates, bromic acids and bromates. For the purposes of the presently claimed invention, the at least one oxidizing agent (G) is peroxide. For example, (G) is hydrogen peroxide.

For the purposes of the presently claimed invention, the concentration of the at least one oxidizing agent (G) is not more than 10 wt. %, more preferably not more than 5 wt. %, more preferably not more than 3.5 wt. %, most preferably not more than 2 wt. %, in each case based on the total weight of the CMP composition (Q). For the purposes of the presently claimed invention, the concentration of the at least one oxidizing agent (G) is at least 0.01 wt. %, more preferably at least 0.05 wt. %, most preferably at least 0.5 wt. %, in each case based on the total weight of the CMP composition (Q).

For the purposes of the presently claimed invention, the concentration of hydrogen peroxide as oxidizing agent is preferably ≥1 wt. % to ≤5 wt. %, more preferably ≥2 wt. % to ≤3.5 wt. %, for instance 2.5 wt. %, most preferably ≥1 wt. % to ≤2 wt. %, in each case based on the total weight of the CMP composition (Q).

The CMP composition (Q) of the presently claimed invention further comprises an aqueous medium (H). The aqueous medium (H) can be of one type or a mixture of different types of aqueous media.

For the purposes of the presently claimed invention, the aqueous medium (H) can be any medium which contains water. Preferably, the aqueous medium (H) is a mixture of water and an organic solvent miscible with water. Representative examples of organic solvent include but are not limited to $C_1$ to $C_3$ alcohol, an alkylene glycol and alkylene glycol derivatives. More preferably, the aqueous medium (H) is water. Most preferably, aqueous medium (H) is de-ionized water.

For the purposes of the presently claimed invention, If the amounts of the components other than (H) are in total y % by weight of the CMP composition (Q), then the amount of (H) is (100-y) % by weight of the CMP composition.

For the purposes of the presently claimed invention, the amount of the aqueous medium (H) in the CMP composition (Q) is not more than 99.9 wt. %, more preferably not more than 99.6 wt. %, most preferably not more than 99 wt. %, particularly preferably not more than 98 wt. %, particularly not more than 97 wt. %, for example not more than 95 wt. %, based on the total weight of the CMP composition (Q). For the purposes of the presently claimed invention, the amount of the aqueous medium (H) in the CMP composition (Q) is at least 60 wt. %, more preferably at least 70 wt. %, most preferably at least 80 wt. %, particularly preferably at least 85 wt. %, particularly at least 90 wt. %, for example at least 93 wt. %, based on the total weight of the CMP composition (Q).

The properties of the CMP composition (Q), such as stability and polishing performance, may depend on the pH of the corresponding composition. For the purposes of the presently claimed invention, the pH value of the CMP composition (Q) is preferably not more than 14, more preferably not more than 13, most preferably not more than 12, particularly preferably not more than 11.5, particularly most preferably not more than 11, particularly not more than 10.7, for example not more than 10.5. For the purposes of the presently claimed invention, the pH value of the CMP composition (Q) is preferably at least 6, more preferably at least 7, most preferably at least 8, particularly preferably at least 8.5, particularly most preferably at least 9, particularly at least 9.5, for example at least 9.7.

For the purposes of the presently claimed invention, the pH value of the CMP composition (Q) is preferably in the range of from ≥6 to ≤14, preferably from ≥7 to ≤13, more preferably from ≥8 to ≤12, most preferably from ≥8 to ≤11, particularly preferably from ≥9 to ≤10.5, particularly more preferably from ≥9 to ≤10.3, particularly most preferably in the range of from ≥9.25 to ≤10.

In an embodiment of the presently claimed invention, the pH of the CMP composition is in the range of from ≥8 to ≤11.

In a preferred embodiment of the presently claimed invention, the pH of the CMP composition is in the range of from ≥9.25 to ≤11.

The CMP composition (Q) of the presently claimed invention can further optionally contain at least one pH adjusting agent (I). The at least one pH adjusting agent (1) is different from the components (A), (B), (C), (D), (E), (F) and (G).

For the purposes of the presently claimed invention, the at least one pH adjusting agent (I) is selected from the group consisting of inorganic acids, carboxylic acids, amine bases, alkali hydroxides, ammonium hydroxides, including tetraalkylammonium hydroxides. Preferably, the at least one pH adjusting agent (I) is selected from the group consisting of nitric acid, sulfuric acid, ammonia, sodium hydroxide and potassium hydroxide. For example, the pH adjusting agent (I) is potassium hydroxide.

For the purposes of the presently claimed invention, the amount of the at least one pH adjusting agent (I) is preferably not more than 10 wt. %, more preferably not more than 2 wt. %, most preferably not more than 0.5 wt. %, particularly not more than 0.1 wt. %, for example not more than 0.05 wt. %, based on the total weight of the CMP composition (Q). For the purposes of the presently claimed invention, the amount of the at least one pH adjusting agent (1) is preferably at least 0.0005 wt. %, more preferably at least 0.005 wt. %, most preferably at least 0.025 wt. %, particularly at least 0.1 wt. %, for example at least 0.4 wt. %, based on the total weight of the CMP composition (Q).

For the purposes of the presently claimed invention, the CMP composition (Q) can optionally contain additives. For the purposes of the presently claimed invention, representative examples of additives include but are not limited to stabilizers. The additives commonly employed in CMP compositions are for example used to stabilize the dispersion, or improve the polishing performance, or the selectivity between different layers.

For the purposes of the presently claimed invention, the concentration of the additives is not more than 10 wt. %, more preferably not more than 1 wt. %, most preferably not more than 0.1 wt. %, for example not more than 0.01 wt. %, based on the total weight of the CMP composition (Q). For the purposes of the presently claimed invention, the concentration of the additives is at least 0.0001 wt. %, more preferably at least 0.001 wt. %, most preferably at least 0.01 wt. %, for example at least 0.1 wt. %, based on the total weight of the CMP composition (Q).

A preferred embodiment of the presently claimed invention is directed to a chemical-mechanical polishing (CMP) composition comprising the following components:
- (A) at least one inorganic abrasive particle selected from the group consisting of metal oxides, metal nitrides, metal carbides, silicides, borides, ceramics, diamond, organic hybrid particles, inorganic hybrid particles and silica;
- (B) at least one chelating agent selected from the group consisting of dicarboxylic acids and tricarboxylic acids;
- (C) at least one corrosion inhibitor selected from the group consisting of unsubstituted benzotriazoles, substituted benzotriazoles, unsubstituted 1,2,3-triazoles, substituted 1,2,3-triazoles, unsubstituted 1,2,4-triazoles and substituted 1,2,4-triazoles;
- (D) at least one non-ionic surfactant comprising a polyoxyalkylene group;
- (E) at least one pad-cleaning agent selected from polymers and co-polymers of acrylic acid, methacrylic acid and maleic acid with a number average molecular weight in the range of ≥500 g/mol to ≤10000 g/mol determined according to gel permeation chromatography at 40° C.;
- (F) at least one carbonate or hydrogen carbonate selected from the group consisting of alkali carbonates or alkali hydrogen carbonates;
- (G) at least one oxidizing agent selected from the group consisting of organic peroxides. inorganic peroxides, persulfates, iodates, periodic acids, periodates, permanganates, perchloric acids, perchlorates, bromic acids and bromates; and
- (H) an aqueous medium.

Another preferred embodiment of the presently claimed invention is directed to a chemical-mechanical polishing (CMP) composition comprising the following components:
- (A) at least one inorganic abrasive particle selected from the group consisting of metal oxides, metal nitrides, metal carbides, silicides, borides, ceramics, diamond, organic hybrid particles, inorganic hybrid particles and silica;
- (B) at least one chelating agent selected from the group consisting of dicarboxylic acids and tricarboxylic acids;
- (C) at least one corrosion inhibitor selected from the group consisting of unsubstituted benzotriazoles, substituted benzotriazoles, unsubstituted 1,2,3-triazoles, substituted 1,2,3-triazoles, unsubstituted 1,2,4-triazoles and substituted 1,2,4-triazoles;
- (D) at least one non-ionic surfactant comprising a polyoxyalkylene group;
- (E) at least one pad-cleaning agent selected from polymers and co-polymers of acrylic acid, methacrylic acid and maleic acid with a number average molecular weight in the range of ≥1000 g/mol to ≤7500 g/mol determined according to gel permeation chromatography at 40° C.;
- (F) at least one carbonate or hydrogen carbonate selected from the group consisting of alkali carbonates or alkali hydrogen carbonates;
- (G) at least one oxidizing agent selected from the group consisting of organic peroxides. inorganic peroxides, persulfates, iodates, periodic acids, periodates, permanganates, perchloric acids, perchlorates, bromic acids and bromates; and
- (H) an aqueous medium,
wherein the pH of the chemical-mechanical polishing (CMP) composition is in the range of ≥8 to ≤11.

Another preferred embodiment of the presently claimed invention is directed to a chemical-mechanical polishing (CMP) composition comprising the following components:
- (A) silica particles;
- (B) a chelating agent selected from carboxylic acids;
- (C) a corrosion inhibitor selected from triazoles;
- (D) an amphiphilic non-ionic surfactant comprising a polyoxyalkylene group;
- (E) a pad-cleaning agent selected from poly (acrylic acid-co-maleic acid) copolymers;
- (F) a carbonate salt;
- (G) a peroxide; and
- (H) an aqueous medium.

Another preferred embodiment of the presently claimed invention is directed to a chemical-mechanical polishing (CMP) composition comprising the following components:
- (A) silica particles;
- (B) citric acid;
- (C) a corrosion-inhibitor (C) selected from the group consisting of unsubstituted benzotriazole, substituted benzotriazoles, unsubstituted 1,2,3-triazole, substituted 1,2,3-triazoles, unsubstituted 1,2,4-triazole and substituted 1,2,4-triazoles;
- (D) an amphiphilic non-ionic surfactant comprising a polyoxyalkylene group;
- (E) a pad-cleaning agent selected from poly (acrylic acid-co-maleic acid) copolymers;
- (F) a carbonate or hydrogen carbonate selected from the group consisting of alkali carbonate or alkali hydrogen carbonate;
- (G) an oxidizing agent selected from the group consisting of organic or inorganic peroxide, a persulfate, an iodate, periodic acid, a periodate, a permanganate, perchloric acid, a perchlorate, bromic acid and a bromate; and
- (H) an aqueous medium.

Another preferred embodiment of the presently claimed invention is directed to a chemical-mechanical polishing (CMP) composition comprising the following components:
- (A) silica particles;
- (B) dicarboxylic acid selected from the group consisting of malonic acid, tartaric acid, succinic acid, adipic acid, malic acid, maleic acid, oxalic acid and fumaric acid;
- (C) a corrosion-inhibitor (C) selected from the group consisting of unsubstituted benzotriazole, substituted benzotriazoles, unsubstituted 1,2,3-triazole, substituted 1,2,3-triazoles, unsubstituted 1,2,4-triazole and substituted 1,2,4-triazoles;
- (D) an amphiphilic non-ionic surfactant comprising a polyoxyalkylene group;
- (E) a pad-cleaning agent selected from poly (acrylic acid-co-maleic acid) copolymers;
- (F) a carbonate or hydrogen carbonate selected from the group consisting of alkali carbonate or alkali hydrogen carbonate;
- (G) an oxidizing agent selected from the group consisting of organic or inorganic peroxide, a persulfate, an iodate, periodic acid, a periodate, a permanganate, perchloric acid, a perchlorate, bromic acid and a bromate; and
- (H) an aqueous medium.

Another preferred embodiment of the presently claimed invention is directed to a chemical-mechanical polishing (CMP) composition comprising the following components:

(A) silica particles;
(B) dicarboxylic acid selected from the group consisting of malonic acid, tartaric acid, succinic acid, adipic acid, malic acid, maleic acid, oxalic acid and fumaric acid;
(C) a corrosion-inhibitor (C) selected from the group consisting of unsubstituted benzotriazole and substituted benzotriazoles;
(D) polyethylene-polypropylene ether;
(E) a pad-cleaning agent selected from poly (acrylic acid-co-maleic acid) copolymers with a number average molecular weight in the range of ≥500 g/mol to ≤10000 g/mol determined according to gel permeation chromatography at 40° C.;
(F) alkali carbonate or alkali hydrogen carbonate; and
(H) an aqueous medium.

Another preferred embodiment of the presently claimed invention is directed to a chemical-mechanical polishing (CMP) composition comprising the following components:
(A) silica particles;
(B) citric acid;
(C) a corrosion-inhibitor (C) selected from the group consisting of unsubstituted benzotriazole and substituted benzotriazoles;
(D) polyethylene-polypropylene ether;
(E) a pad-cleaning agent selected from poly (acrylic acid-co-maleic acid) copolymers with a number average molecular weight in the range of ≥500 g/mol to ≤10000 g/mol determined according to gel permeation chromatography at 40° C.;
(F) alkali carbonate or alkali hydrogen carbonate; and
(H) an aqueous medium.

Another preferred embodiment of the presently claimed invention is directed to a chemical-mechanical polishing (CMP) composition comprising the following components:
(A) at least one inorganic abrasive particle selected from the group consisting of a metal oxide, a metal nitride, a metal carbide, a silicide, a boride, a ceramic, a diamond, an organic/inorganic hybrid particle and silica;
(B) at least one chelating agent selected from the group consisting of dicarboxylic acids and tricarboxylic acids;
(C) at least one corrosion inhibitor selected from the group consisting of unsubstituted benzotriazole, substituted benzotriazoles, unsubstituted 1,2,3-triazole, substituted 1,2,3-triazoles, unsubstituted 1,2,4-triazole and substituted 1,2,4-triazoles;
(D) at least one non-ionic surfactant comprising a polyoxyalkylene group;
(E) at least one pad-cleaning agent selected from polymers and co-polymers of acrylic acid, methacrylic acid and maleic acid with a number average molecular weight in the range of ≥500 g/mol to ≤10000 g/mol determined according to gel permeation chromatography at 40° C.;
(F) at least one carbonate or hydrogen carbonate salt selected from the group consisting of alkali carbonate or alkali hydrogen carbonate;
(G) at least one oxidizing agent selected from the group consisting of organic or inorganic peroxide, a persulfate, an iodate, periodic acid, a periodate, a permanganate, perchloric acid, a perchlorate, bromic acid and a bromate; and
(H) an aqueous medium, wherein the pH of the chemical-mechanical polishing (CMP) composition is in the range of ≥ 8 to ≤11.

Another preferred embodiment of the presently claimed invention is directed to a chemical-mechanical polishing (CMP) composition comprising the following components:
(A) ≥0.01 wt. % to ≤5 wt. % of at least one inorganic abrasive particle;
(B) ≥0.001 wt. % to ≤2.5 wt. % of at least one chelating agent selected from carboxylic acids;
(C) ≥0.001 wt. % to ≤1 wt. % of at least one corrosion inhibitor selected from unsubstituted or substituted triazoles;
(D) ≥0.01 wt. % to ≤1 wt. % of at least one non-ionic surfactant comprising at least one polyoxyalkylene group;
(E)≥0.001 wt. % to ≤1 wt. % of at least one pad-cleaning agent selected from polymers and co-polymers of acrylic acid, methacrylic cid and maleic acid;
(F) ≥0.001 wt. % to ≤1 wt. % of at least one carbonate or hydrogen carbonate;
(G) ≥1 wt. % to ≤2 wt. % of at least one oxidizing agent selected from the group consisting of organic peroxides, inorganic peroxides, persulfates, iodates, periodic acids, periodates, permanganates, perchloric acids, perchlorates, bromic acids and bromates; and
(H) aqueous medium, wherein the weight percentages are in each case is based on the total weight of the chemical-mechanical polishing composition (CMP).

Another preferred embodiment of the presently claimed invention is directed to a chemical-mechanical polishing (CMP) composition comprising the following components:
(A) ≥0.01 wt. % to ≤5 wt. % of at least one inorganic abrasive particle;
(B) ≥0.001 wt. % to ≤2.5 wt. % of at least one chelating agent selected from carboxylic acids;
(C) ≥0.001 wt. % to ≤1 wt. % of at least one corrosion inhibitor selected from unsubstituted or substituted triazoles;
(D) ≥0.01 wt. % to ≤1 wt. % of at least one non-ionic surfactant comprising at least one polyoxyalkylene group;
(E) ≥0.001 wt. % to ≤1 wt. % of at least one pad-cleaning agent selected from poly (acrylic acid-co-maleic acid) copolymers;
(F) ≥0.001 wt. % to ≤1 wt. % of at least one carbonate or hydrogen carbonate;
(G) ≥1 wt. % to ≤2 wt. % of at least one oxidizing agent selected from the group consisting of organic peroxides, inorganic peroxides, persulfates, iodates, periodic acids, periodates, permanganates, perchloric acids, perchlorates, bromic acids and bromates; and
(H) aqueous medium, wherein the weight percentages are in each case is based on the total weight of the chemical-mechanical polishing composition (CMP); and wherein the pH of the chemical-mechanical polishing (CMP) composition is in the range of ≥8 to ≤11.

Another preferred embodiment of the presently claimed invention is directed to a chemical-mechanical polishing (CMP) composition comprising the following components:
(A) ≥0.01 wt. % to ≤5 wt. % of colloidal silica;
(B) ≥0.001 wt. % to ≤2.5 wt. % of dicarboxylic acid selected from the group consisting of malonic acid, tartaric acid, succinic acid, adipic acid, malic acid, maleic acid, oxalic acid and fumaric ac;
(C) ≥0.001 wt. % to ≤1 wt. % of at least one corrosion inhibitor selected from the group consisting of unsubstituted benzotriazoles and substituted benzotriazoles;

(D) ≥0.01 wt. % to ≤1 wt. % of at least one non-ionic surfactant comprising at least one polyoxyalkylene group;
(E) ≥0.001 wt. % to ≤1 wt. % of at least one pad-cleaning agent selected from poly (acrylic acid-co-maleic acid) copolymers with a number average molecular weight in the range of ≥ 500 g/mol to ≤10000 g/mol determined according to gel permeation chromatography at 40° C.;
(F) ≥0.001 wt. % to ≤1 wt. % of alkali carbonate or alkali hydrogen carbonate; and (H) aqueous medium, wherein the weight percentages are in each case is based total weight of the chemical-mechanical polishing composition (CMP).

Another preferred embodiment of the presently claimed invention is directed to a chemical-mechanical polishing (CMP) composition comprising the following components:
(A) ≥0.01 wt. % to ≤5 wt. % of colloidal silica;
(B) ≥0.001 wt. % to ≤2.5 wt. % of citric acid;
(C) ≥0.001 wt. % to ≤1 wt. % of at least one corrosion inhibitor selected from the group consisting of unsubstituted benzotriazoles and substituted benzotriazoles;
(D) ≥0.01 wt. % to ≤1 wt. % of at least one non-ionic surfactant comprising at least one polyoxyalkylene group;
(E) ≥0.001 wt. % to ≤1 wt. % of at least one pad-cleaning agent selected from poly (acrylic acid-co-maleic acid) copolymers;
(F) ≥0.001 wt. % to ≤1 wt. % of alkali carbonate or alkali hydrogen carbonate; and
(H) aqueous medium, wherein the weight percentages are in each case is based total weight of the chemical-mechanical polishing composition (CMP); and wherein the pH of the chemical-mechanical polishing (CMP) composition is in the range of ≥9.25 to ≤11.

Another preferred embodiment of the presently claimed invention is directed to a chemical-mechanical polishing (CMP) composition comprising the following components:
(A) ≥0.01 wt. % to ≤3 wt. % of at least one inorganic abrasive particle selected from the group consisting of metal oxides, metal nitrides, metal carbides, silicides, borides, ceramics, diamond, organic hybrid particles, inorganic hybrid particles and silica;
(B)≥0.01 wt. % to ≤1 wt. % of at least one chelating agent selected from the consisting of dicarboxylic acids and tricarboxylic acids;
group
(C) ≥0.001 wt. % to ≤1 wt. % of at least one corrosion inhibitor selected from the group consisting of unsubstituted benzotriazoles, substituted benzotriazoles, unsubstituted 1,2,3-triazoles, substituted 1,2,3-triazoles, unsubstituted 1,2,4-triazoles and substituted 1,2,4-triazoles;
(D) ≥0.002 wt. % to ≤0.5 wt. % of at least one non-ionic surfactant comprising at least one polyoxyalkylene group;
(E) ≥0.001 wt. % to ≤0.5 wt. % of at least one pad-cleaning agent selected from poly (acrylic acid-co-maleic acid) copolymers;
(F) ≥0.001 wt. % to ≤1 wt. % of at least one carbonate or hydrogen carbonate selected from the group consisting of alkali carbonates or alkali hydrogen carbonates; and
(G) ≥1 wt. % to ≤2 wt. % of at least one oxidizing agent selected from the group consisting of organic peroxides, inorganic peroxides, persulfates, iodates, periodic acids, periodates, permanganates, perchloric acids, perchlorates, bromic acids and bromates, and
(H) aqueous medium, wherein the weight percentages are in each case is based total weight of the chemical-mechanical polishing composition (CMP).

Another preferred embodiment of the presently claimed invention is directed to a chemical-mechanical polishing (CMP) composition comprising the following components:
(A) ≥0.01 wt. % to ≤1.8 wt. % of colloidal silica;
(B) ≥0.01 wt. % to ≤1 wt. % of at least one chelating agent selected from the group consisting of dicarboxylic acids and tricarboxylic acids;
(C) ≥0.001 wt. % to ≤1 wt. % of at least one corrosion inhibitor selected from the group consisting of unsubstituted benzotriazoles or substituted benzotriazoles;
(D) ≥0.002 wt. % to ≤0.5 wt. % of at least one non-ionic surfactant comprising at least one polyoxyalkylene group;
(E) ≥0.001 wt. % to ≤0.5 wt. % of at least one pad-cleaning agent selected from poly (acrylic acid-co-maleic acid) copolymers;
(F) ≥0.001 wt. % to ≤1 wt. % of at least one carbonate or hydrogen carbonate selected from the group consisting of alkali carbonates or alkali hydrogen carbonates; and
(G) ≥1 wt. % to ≤2 wt. % of at least one oxidizing agent selected from the group consisting of organic peroxides, inorganic peroxides, persulfates, iodates, periodic acids, periodates, permanganates, perchloric acids, perchlorates, bromic acids and bromates, and
(H) aqueous medium, wherein the weight percentages are in each case is based total weight of the chemical-mechanical polishing composition (CMP); and wherein the pH of the chemical-mechanical polishing (CMP) composition is in the range of ≥9.25 to ≤11.

The processes for preparation of CMP compositions are generally known. These processes may be applied to the preparation of the CMP composition of the presently claimed invention. This can be carried out by dispersing or dissolving the components described hereinabove (A), (B), (C), (D), (E), (F), (G) and other optional components in the aqueous medium (H), preferably water, and optionally by adjusting the pH value through adding an acid, a base, a buffer or a pH adjusting agent. For this purpose, the customary and standard mixing processes and mixing apparatuses such as agitated vessels, high shear impellers, ultrasonic mixers, homogenizer nozzles or counter flow mixers, can be used.

The polishing process is generally known and can be carried out with the processes and the equipment under the conditions customarily used for the CMP in the fabrication of wafers with integrated circuits. There is no restriction on the equipment with which the polishing process can be carried out. As is known in the art, the typical equipment for the CMP process consists of a rotating platen which is covered with a polishing pad. Also, orbital polishers can be used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the presently claimed invention the CMP composition of the presently claimed invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard-polishing pad is used, because the down pressure distribution on the wafer is more uniform compared to that of a carrier with a hard platen design. Carriers with the option to control the pressure distribution on the wafer may also be used according to the presently claimed invention. They are usually designed with several different chambers that can be loaded to a certain degree independently from each other.

Generally, the down pressure or down force is a downward pressure or a downward force which is applied by the carrier to the wafer pressing it against the pad during CMP. This down pressure or down force can for example be measured in pound per square inch (abbreviated as psi)

According to the process of the presently claimed invention, the down pressure is 2 psi or lower. Preferably the down pressure is in the range of from 0.1 psi to 1.9 psi, more preferably in the range of from 0.3 psi to 1.8 psi, most preferably in the range of from 0.4 psi to 1.7 psi, particularly preferable in the range of from 0.8 psi to 1.6 psi, for example 1.5 psi.

An aspect of the presently claimed invention is directed to a method for the manufacture of semiconductor devices comprising the chemical-mechanical polishing of a substrate in the presence of the chemical-mechanical polishing composition (Q) described hereinabove and hereinbelow.

According to the presently claimed invention the method for the manufacture of semiconductor devices comprises the CMP of a substrate comprising a surface region containing or consisting of at least one copper layer and/or at least one ruthenium layer or alloys thereof.

In a preferred embodiment of the presently claimed invention, the substrate comprises at least one copper layer and/or at least one ruthenium layer or alloys thereof.

The semiconductor device which can be manufactured by the process according to the presently claimed invention is not particularly limited. The semiconductor devices can be electronic components comprising semiconducting materials, as for example silicon, germanium, and III-V materials. Semiconductor devices can be those which are manufactured as single discrete devices or those which are manufactured as integrated circuits (ICs) consisting of several devices manufactured and interconnected on a wafer. Semiconductor devices can be two terminal devices for example a diode, three terminal devices for example a bipolar transistor, four terminal devices for example a Hall effect sensor or multi-terminal devices. Preferably, the semiconductor device is a multi-terminal device. Multi-terminal devices can be logic devices as integrated circuits and microprocessors or memory devices as random-access memory (RAM), read only memory (ROM) and phase change random access memory (PCRAM). Preferably the semiconductor device is a multi-terminal logic device. In particular, the semiconductor device is an integrated circuit or microprocessor.

Generally, in integrated circuits ruthenium (Ru) is used as adhesion or barrier layer for copper interconnects. In its nano-crystalline form ruthenium is contained for example in memory devices and as metal gate in MOSFET. Ruthenium can also be used as a seed to enable plating of copper by electro-deposition. Ruthenium and ruthenium alloy can also be used as wiring instead of copper for one or more layers. For example, a capacitor (CAP) can be formed by successive layers of metal, insulator, metal (MIM) and a thin film resistor at the same level. Circuit designers can now wire to the TaN thin film resistor at the lowest metal level, which reduces parasitics and allows more efficient usage of the existing wiring levels. The excess copper and/or ruthenium and the adhesion/barrier layer comprising ruthenium in form of, for example metal nitrides or metal carbon nitrides, such as Ru/TaN, Ru/TIN, Ru/TaCN, Ru/TiCN, or for example as a single ruthenium alloy layer, such as RuMo, *RuTa*, RuTi and RuW above the dielectrics, can be removed by the chemical mechanical polishing process according to the presently claimed invention.

Generally, this ruthenium and/or ruthenium alloy can be produced or obtained in different ways. Ruthenium and ruthenium alloy can be produced by ALD, PVD or CVD processes. It is possible that ruthenium or ruthenium alloy is deposited onto a barrier material. Proper materials for barrier application are well known in the arts. The barrier prevents metal atoms or ions like ruthenium or copper from diffusing into the dielectric layer and improves the adhesion properties of the conductive layer. Ta/TaN, Ti/TIN can be used.

Generally, this ruthenium and/or ruthenium alloy can be of any type, form, or shape. This ruthenium and/or ruthenium alloy preferably has the shape of a layer and/or overgrowth. If this ruthenium and/or ruthenium alloy has the shape of a layer and/or overgrowth, the ruthenium and/or ruthenium alloy content is preferably more than 90%, more preferably more than 95%, most preferably more than 98%, particularly more than 99%, for example more than 99.9% by weight of the corresponding layer and/or overgrowth. This ruthenium and/or ruthenium alloy has been preferably filled or grown in trenches or plugs between other substrates, more preferably filled or grown in trenches or plugs in dielectric materials like for example SiO2, silicon, low-k (BD1, BD2) or ultra-low-k materials, or other isolating and semiconducting material used in the semiconductor industry. For example, in the Through Silicon Vias (TSV) middle process insulated materials such as polymers, photoresist and/or polyimide can be used as insulating material between the subsequent processing steps of wet etch and CMP for insulating/isolating properties after revealing the TSV from the backside of the wafer. Between the copper comprising and the dielectric material can be a thin layer of a barrier material. Generally, barrier materials to prevent metal ions from diffusing into the dielectric material can for example be Ti/TIN, Ta/TaN or Ru or Ru-alloys, Co or Co-alloys.

As far as barrier layers and low-k or ultra-low-k materials are present in the semiconductor substrate used, the CMP composition of the presently claimed invention preferably removes the barrier layers and maintain the integrity of the low-k and ultra-low-k materials, i.e., provides a particularly high selectivity of barrier layer over low-k or ultra-low-k materials regarding the material removal rates (MRRs). Particularly, as far as copper layers, barrier layers and low-k or ultra-low-k materials are present in the substrate to be polished, the CMP composition of the presently claimed invention provides at least one of the following properties:

(a) high MRR of barrier layer, (b) low MRR of copper layer, (c) low MRR of low-k or ultra-low-k materials, (d) high selectivity of barrier layer over copper layer with regard to MRR, (e) high selectivity of barrier layer over low-k and ultra-low-k materials with regard to MRR. Most particularly, as far as copper layers, ruthenium, cobalt, tantalum or tantalum nitride layers and low-k or ultra-low-k materials are present in the substrate to be polished, the CMP composition of the presently claimed invention provides at least one of the following properties: (a') high MRR of tantalum or tantalum nitride, (b') low MRR of copper layer, (c') low MRR of low-k or ultra-low-k materials, (d') high selectivity of ruthenium, tantalum or tantalum nitride over copper with regard to MRR, and (e') high selectivity of tantalum nitride or ruthenium over low-k or ultra-low-k materials with regard to MRR. Furthermore, the CMP composition of the presently claimed invention provides a long shelf life, while high MRR of barrier layer is maintained.

For the purposes of the presently claimed invention, the selectivity of ruthenium to copper with regard to the material removal rate is preferably higher than 0.05, more preferably higher than 0.2, most preferably higher than 1, particularly higher than 2.5, especially higher than 20, for example higher than 40. The selectivity may be advantageously adjusted by the combination of high material removal rate (MRR) of ruthenium and low MRR of copper or the other way around.

The CMP composition of the presently claimed invention can be used in the CMP process as ready-to-use slurry, they have a long shelf-life and show a stable particle size distribution over long time. Thus, they are easy to handle and to store. They show an excellent polishing performance, particularly with regard to (a') high MRR of tantalum nitride, (b') high MRR of ruthenium (c') low MRR of copper layer, (d') low MRR of low-k or ultra-low-k materials, (e') high selectivity of tantalum nitride or ruthenium over copper with regard to MRR, and (e') high selectivity of tantalum nitride or ruthenium over low-k or ultra-low-k materials with regard to MRR. Furthermore, the CMP composition of the presently claimed invention shows a longer shelf life, agglomeration within the CMP composition of the presently claimed invention can be avoided, while high MRR of barrier layer was maintained. Since the amounts of its components are held down to a minimum, the CMP composition (Q) and the CMP process according to the presently claimed invention can be used or applied in a cost-effective way.

An aspect of the presently claimed invention is directed to a use of the chemical-mechanical polishing composition of the presently claimed invention for chemical-mechanical polishing of a substrate used in the semiconductor industry.

In an embodiment of the presently claimed invention, the use of the chemical-mechanical polishing composition of the presently claimed invention for chemical-mechanical polishing of a substrate, the substrate comprises
(i) copper, and/or
(ii) tantalum, tantalum nitride, titanium, titanium nitride, ruthenium, cobalt or alloys thereof.

In another embodiment of the presently claimed invention, the use of the chemical-mechanical polishing composition of the presently claimed invention for chemical-mechanical polishing of a substrate, the substrate comprises
(i) copper, and/or
(ii) tantalum, tantalum nitride, titanium, titanium nitride, ruthenium, or ruthenium alloys thereof.

The chemical-mechanical polishing composition according to the presently claimed invention has at least one of the following advantages:
(i) a high material removal rate (MRR) of the substrate to be preferably polished, for example tantalum or tantalum nitride or alloys thereof,
(ii) a high material removal rate (MRR) of the substrate to be preferably polished, for example ruthenium or ruthenium alloys thereof,
(iii) a low material removal rate (MRR) of the substrate to be preferably polished, for example copper and/or low k material,
(iv) a clean pad polishing surface free of metal debris by addition of a pad-cleaning agent in the CMP composition Embodiments In the following, there is provided a list of embodiments to further illustrate the present disclosure without intending to limit the disclosure to the specific embodiments listed below.

1. A chemical-mechanical polishing (CMP) composition comprising
   (A) at least one inorganic abrasive particle;
   (B) at least one chelating agent selected from carboxylic acids;
   (C) at least one corrosion inhibitor selected from unsubstituted or substituted triazoles;
   (D) at least one non-ionic surfactant comprising at least one polyoxyalkylene group;
   (E) at least one pad-cleaning agent selected from polymers and co-polymers of acrylic acid, methacrylic acid and maleic acid;
   (F) at least one carbonate or hydrogen carbonate;
   (G) at least one oxidizing agent selected from the group consisting of organic peroxides, inorganic peroxides, persulfates, iodates, periodic acids, periodates, permanganates, perchloric acids, perchlorates, bromic acids and bromates;
   and
   (H) an aqueous medium.

2. The chemical-mechanical polishing (CMP) composition according to embodiment 1, wherein the at least one inorganic abrasive particle (A) is selected from the group consisting of metal oxides, metal nitrides, metal carbides, silicides, borides, ceramics, diamond, organic hybrid particles, inorganic hybrid particles and silica.

3. The chemical-mechanical polishing (CMP) composition according to embodiment 1, wherein the average particle diameter of the at least one inorganic abrasive particle (A) is in the range of $\geq 1$ nm to $\leq 1000$ nm determined according to dynamic light scattering technique.

4. The chemical-mechanical polishing (CMP) composition according to embodiment 1, wherein the concentration of the at least one inorganic abrasive particle (A) is in the range of from $\geq 0.01$ wt. % to $\leq 10$ wt. %, based on the total weight of the chemical-mechanical polishing composition.

5. The chemical-mechanical polishing (CMP) composition according to any of the embodiments 1 to 4, wherein the carboxylic acids are selected from the group consisting of dicarboxylic acids and tricarboxylic acids.

6. The chemical-mechanical polishing (CMP) composition according to embodiment 5, wherein the tricarboxylic acid is citric acid.
7. The chemical-mechanical polishing (CMP) composition according to embodiment 5, wherein the dicarboxylic acid is selected from the group consisting of malonic acid, tartaric acid, succinic acid, adipic acid, malic acid, maleic acid, oxalic acid and fumaric acid.
8. The chemical-mechanical polishing (CMP) composition according to any of the embodiments 1 to 7, wherein the concentration of the at least one chelating agent (B) is in the range of from ≥0.001 wt. % to ≤2.5 wt. % based on the total weight of the chem-ical-mechanical polishing composition.
9. The chemical-mechanical polishing (CMP) composition according to any of the embodiments 1 to 8, wherein the triazoles are selected from the group consisting of unsubstituted benzotriazoles, substituted benzotriazoles, unsubstituted 1,2,3-triazoles, substituted 1,2,3-triazoles, unsubstituted 1,2,4-triazoles and substituted 1,2,4-triazoles.
10. The chemical-mechanical polishing (CMP) composition according to embodiment 9, wherein the substituted benzotriazole is selected from the group consisting of 4-methyl benzotriazole, 5-methyl benzotriazole, 5,6-dimethyl-benzotriazole, 5-chloro-benzotriazole, 1-octanyl benzotriazole, carboxy-benzotriazole, butyl-benzotriazole, 6-ethyl-1H-1,2,4 benzotriazole, (1-pyrrolidinyl methyl) benzotriazole, 1-n-butyl-benzotriazole, benzotriazole-5-carboxylic acid, 4,5,6,7-tetrahydro-1H-benzotriazole, tolyltriazole, 5-bromo-1H-benzotriazole, 5-tert-butyl-1·H-benzotriazole, 5-(benzoyl)-1H-benzotriazole, 5,6-dibromo-1H-benzotriazole and 5-sec-butyl-1H-benzotriazole.
11. The chemical-mechanical polishing (CMP) composition according to any of the embodiments 1 to 10, wherein the concentration of the at least one corrosion-inhibitor (C) is in the range of ≥0.001 wt. % to ≤1 wt. % of the total weight of the chemical-mechanical polishing composition.
12. The chemical-mechanical polishing (CMP) composition according to embodiment 1, wherein the concentration of the non-ionic surfactant comprising at least one polyoxyalkylene group (D) is in the range of ≥0.01 wt. % to ≤10 wt. % based on the total weight of the chemical-mechanical polishing composition.
13. The chemical-mechanical polishing (CMP) composition according to any of the embodiments 1 to 12, wherein the polymers and co-polymers of acrylic acid, methacrylic acid and maleic acid have a number average molecular weight in the range of ≥500 g/mol to ≤10000 g/mol.
14. The chemical-mechanical polishing (CMP) composition according to any of the embodiments 1 to 13, wherein the concentration of the pad-cleaning agent (E) is in the range of ≥0.001 wt. % to ≤1 wt. % based on the total weight of the chemical-mechanical polishing composition.
15. The chemical-mechanical polishing (CMP) composition according to any of the embodiments 1 to 14, wherein the pH of the chemical-mechanical polishing composition is in the range of from 8 to 11.
16. The chemical-mechanical polishing (CMP) composition according to any of the embodiments 1 to 14, wherein the pH of the chemical-mechanical polishing composition is in the range of from 9.25 to 11.

17. A chemical-mechanical polishing (CMP) composition according to any of the embodiments 1 to 16 comprising
(A) ≥0.01 wt.-% to ≤5 wt.-% of at least one inorganic abrasive particle;
(B) ≥0.001 wt.-% to ≤2.5 wt.-% of at least one chelating agent selected from carboxylic acids;
(C) ≥0.001 wt.-% to ≤1 wt. % of at least one corrosion inhibitor selected from unsubstituted or substituted triazoles;
(D) ≥0.01 wt.-% to ≤1 wt.-% of at least one non-ionic surfactant comprising at least one polyoxyalkylene group;
(E) ≥0.001 wt.-% to ≤1 wt.-% of at least one pad-cleaning agent selected from polymers and co-polymers of acrylic acid, methacrylic acid and maleic acid;
(F) ≥0.001 wt.-% to ≤1 wt. % of at least one carbonate or hydrogen carbonate;
(G) ≥1 wt.-% to ≤2 wt. % of at least one oxidizing agent selected from the group consisting of organic peroxides, inorganic peroxides, persulfates, iodates, periodic acids, periodates, permanganates, perchloric acids, perchlorates, bromic acids and bromates; and
(H) aqueous medium,
wherein the weight percentages are in each case is based on the total weight of the chemical-mechanical polishing composition (CMP).
18. A chemical-mechanical polishing (CMP) composition according to any of the embodiments 1 to 17 comprising
(A) at least one inorganic abrasive particle selected from the group consisting of metal oxides, metal nitrides, metal carbides, silicides, borides, ceramics, diamond, organic hybrid particles, inorganic hybrid particles and silica;
(B) at least one chelating agent selected from the group consisting of dicarboxylic acids and tricarboxylic acids;
(C) at least one corrosion inhibitor selected from the group consisting of unsubstituted benzotriazoles, substituted benzotriazoles, unsubstituted 1,2,3-triazoles, substituted 1,2,3-triazoles, unsubstituted 1,2,4-triazoles and substituted 1,2,4-triazoles;
(D) at least one non-ionic surfactant comprising a polyoxyalkylene group;
(E) at least one pad-cleaning agent selected from polymers and co-polymers of acrylic acid, methacrylic acid and maleic acid;
(F) at least one carbonate or hydrogen carbonate selected from the group consisting of alkali carbonates or alkali hydrogen carbonates;
(G) at least one oxidizing agent selected from the group consisting of organic peroxides. inorganic peroxides, persulfates, iodates, periodic acids, periodates, permanganates, perchloric acids, perchlorates, bromic acids and bromates; and
(H) an aqueous medium.
19. A chemical-mechanical polishing (CMP) composition according to any of the embodiments 1 to 18 comprising
(A) ≥0.01 wt.-% to ≤5 wt.-% of at least one inorganic abrasive particle selected from the group consisting of metal oxides, metal nitrides, metal carbides, silicides, borides, ceramics, diamond, organic hybrid particles, inorganic hybrid particles and silica;

(B) ≥0.001 wt.-% to ≤2.5 wt.-% of at least one chelating agent selected from the group consisting of dicarboxylic acids and tricarboxylic acids;

(C) ≥0.001 wt.-% to ≤1 wt. % of at least one corrosion inhibitor selected from the group consisting of unsubstituted benzotriazoles, substituted benzotriazoles, unsubstituted 1,2,3-triazoles, substituted 1,2,3-triazoles, unsubstituted 1,2,4-triazoles and substituted 1,2,4-triazoles;

(D) ≥0.01 wt.-% to ≤1 wt.-% of at least one non-ionic surfactant comprising at least one polyoxyalkylene group;

(E) ≥0.001 wt.-% to ≤1 wt.-% of at least one pad-cleaning selected from poly (acrylic acid-co-maleic acid) copolymers;

(F) ≥0.001 wt.-% to ≤1 wt. % of at least one carbonate or hydrogen carbonate selected from the group consisting of alkali carbonates or alkali hydrogen carbonates; and (G) ≥1 wt.-% to ≤2 wt. % of at least one oxidizing agent selected from the group consisting of organic peroxides, inorganic peroxides, persulfates, iodates, periodic acids, periodates, permanganates, perchloric acids, perchlorates, bromic acids and bromates, and (H) aqueous medium, wherein the weight percentages are in each case is based total weight of the chemi-cal-mechanical polishing composition (CMP).

20. A method for the manufacture of semiconductor devices comprising the chemical-mechanical polishing of a substrate in the presence of a chemical-mechanical polishing (CMP) composition according to any of the embodiments 1 to 19.

21. The method according to embodiment 20, wherein the substrate comprises at least one copper layer and/or at least one ruthenium layer.

22. Use of a chemical-mechanical polishing composition according to any of the embodiments 1 to 19 for chemical-mechanical polishing of a substrate used in the semiconductor industry.

23. The use according to embodiment 22, wherein the substrate comprises
(i) copper, and/or
(ii) tantalum, tantalum nitride, titanium, titanium nitride, ruthenium, or ruthenium alloys thereof.

While the presently claimed invention has been described in terms of its specific embodiments, certain modifications and equivalents will be apparent to those skilled in the art and are intended to be included within the scope of the presently claimed invention

Examples and Comparative Examples

The presently claimed invention is illustrated in detail by the working examples which follow. More particularly, the test methods specified hereinafter are part of the general disclosure of the application and are not restricted to the specific working examples.

The general procedure for the CMP experiments is described below.

Slurry composition:

Silica based slurries were used to polish copper and/or ruthenium coated wafers. The slurry composition comprises:

(A) an inorganic abrasive: silica particles commercially available under the trade-name Fuso® PL-3 from Fuso Chemical Corporation (B) a chelating agent: citric acid, available from Sigma-Aldrich (C) a corrosion inhibitor: benzotriazole (BTA), available from, Sigma-Aldrich (D) a non-ionic surfactant, polyethylene-polypropylene ether (Triton® DF 16), available from (E) a pad-cleaning agent,
poly (acrylic acid-co maleic acid) with a weight average molecular weight of 3000
g/mol (Planapur® CP 12 SEG), available from BASF SE, Ludwigshafen (F) a carbonate salt, $K_2CO_3$, available from Sigma-Aldrich (G) an oxidizing agent $H_2O_2$, available from and (H) water The oxidizing agent (G) (1% $H_2O_2$) was added right before (1 to 15 min) the slurry had been used for chemical mechanical polishing (CMP).

Methods

Procedure for Preparation of the Slurry Composition

The components in the slurry composition are thoroughly mixed and all mixing procedures are carried out under stirring. An aqueous stock solution of each compound (B), (C), (D), (E), (F) and (G) are prepared by dissolving the desired amount of the respective compound in ultra-pure water (UPW). For the stock solutions of the components, KOH is preferably used to support dissolution. The pH of the stock solution is adjusted to ~ pH 9 by KOH. The stock solutions of (B) have a concentration of the respective additive of 10 wt. %, that of (C), (D) and (E) of 1.0 wt. %. For (A) a dispersion is used as provided by the supplier, typically about 20%-30% abrasive concentration by weight. The oxidizing agent (G) is used as 30 wt. % stock solutions.

To prepare 10000 g of slurry required amount of (F) stock solution is given into a mixing tank or a beaker and then pH is adjusted by adding KOH with a stirring speed of 350 rpm. The amounts of stock solutions of (B), (C), (D) and (E) are added to reach the desired concentra-tions. KOH is used to keep the solution at desired alkaline pH. Then (A) is added with the necessary amount. To adjust final concentration, (H) is added as balance water, with respect to the necessary amount of oxidizer stock solution. The pH is adjusted to the desired value by KOH. The oxidizer is added with the desired amount (1 wt. %) about 60 min before chemical mechanical polishing.

Inorganic Particles (A) Used in the Examples

Colloidal cocoon-shaped silica particles (A1) having an average primary particle size (d1) of nm and an average secondary particle size (d2) of 70 nm (as determined using dynamic light scattering techniques via a Horiba instrument) (for example Fuso® PL-3) and a specific surface area of around 46 $m^2/g$ were used.

Procedure for Particle Shape Characterization

An aqueous cocoon-shaped silica particle dispersion with 20 wt. % solid content was dispersed on a carbon foil and was dried. The dried dispersion was analyzed by using Energy Filtered-Transmission Electron Microscopy (EF-TEM) (120 kilo volts) and Scanning Electron Microscopy secondary electron image (SEM-SE) (5 kilo volts). The EF-TEM image with a resolution of 2 k, 16 Bit, 0.6851 nm/pixel was used for the analysis. The images were binary coded using the threshold after noise suppression. Afterwards the particles were manually separated. Overlying and edge particles were discriminated and not used for the analysis. ECD, shape factor and sphericity as defined before were calculated and statistically classified.

A2 are agglomerated particles with a specific surface area of around 90 m²/g having an average primary particle size (d1) of 35 nm and an average secondary particle size (d2) of 75 nm (as determined using dynamic light scattering techniques via a Horiba instrument) (for example Fuso® PL-3H) were used.

Standard CMP process for 200 mm barrier polishing wafers:
Apparatus: Mirra-mesa (Applied Materials)
  down pressure: 1.5 psi for all substrates, Ru 2 psi;
  polishing table/carrier speed: 93/87 rpm;
  slurry flow rate: 200 ml/min;
  polishing time: Ru 60 s, Cu 60 s, TEOS 60 s, TaN 60 s, BD2 60 s
  polishing pad: Fujibo $H_{800}$ NW;
  conditioning tool: 3M A189L diamond abrasive disk for AMAT CMP ma-chines, in-situ conditioning with 5 lbf down force.
Apparatus: GnP (G&P Technology)
  down pressure: 2 psi for coupon wafer
  polishing table/carrier speed: 93/87 rpm
  slurry flow rate: 200 ml/min
  polishing time: Ru 60 s, Cu 60 s, TEOS 60 s, TaN 60 s, BD2 60 s for main polishing.
  polishing pad: Fujibo $H_{800}$ NW
  conditioning tool: A189L
  conditioning type: In-situ. Oscillation. 65 rpm, downforce 5 lbf for main polishing 60s
The slurry is stirred in a local supply station.
Standard analysis procedure for film thickness measurement:
  Cu and Ru film: Resistage RG-120/RT-80, 4 point probe instrument (NAPSON Corporation)
  TEOS: Opti-Probe 2600 (Therma Wave, KLA-Tencor)
  TaN: Resistage RG-120/RT-80, 4 point probe instrument (NAPSON Corporation)
  BD1: Opti-Probe 2600 (Therma Wave, KLA-Tencor)
Film thickness is measured pre and post CMP with a 49-point scan (5 mm edge exclusion). The thickness loss is averaged and divided by the polishing time to give the material removal rate (MRR).
  Ru coated wafers: Resistage RG-120/RT-80, 4-point probe instrument (NAPSON Corporation)
  Cu coated wafers: Resistage RG-120/RT-80, 4-point probe instrument (NAPSON Corporation)
  TaN: Resistage RG-120/RT-80, 4-point probe instrument (NAPSON Corporation)
  TEOS: Opti-Probe 2600 (Therma Wave, KLA-Tencor)
  BD2: Opti-Probe 2600 (Therma Wave, KLA-Tencor)
  BD1: Opti-Probe 2600 (Therma Wave, KLA-Tencor)
Measurement of pH
The pH-value is measured with a pH combination electrode (Schott, blue line 22 pH electrode).
Pad Staining Experiments on 200 mm Mirra Messa Polisher
Chemical mechanical polishing (CMP) generally results in polishing debris which is not desired in the CMP process. Moreover, the adsorbed or accumulated debris on the polishing pad can generate additional defect on the wafer resulting additional defects which are not desired. Therefore, adsorption of debris on the pad surface should be prevented. To evaluate the different slurry compositions and the impact of the different parameters, the following test procedure was developed and named as pad staining experiments. Pad staining experiments were conducted in two different ways with and without copper (Cu) ions to generate different debris during polishing. The slurry was prepared as described hereinabove.

Pad Staining Experiment with Copper (Cu) Ions
Pad staining experiments with copper ions were conducted by adding 50 ppm $CuSO_4 \cdot 5H_2O$ to the slurry prior polishing on a Fujibo H804 pad and the mixture was then applied on the pad while polishing a ruthenium (Ru) wafer until the coated ruthenium film is totally removed from the wafer surface. Then the pad was removed from the polisher to let it dry completely. Pad picture was taken, and picture analysis was done by using an imaging software. This experiment resembles accumulation of ruthenium and copper debris on pad. Fujibo $H_{804}$ pad was used in these experiments for easier analysis of the stains (species accumulation) on the pad since it is a white pad.
Pad Staining Experiments on GnP Polisher:
Pad Staining Experiment with Copper (Cu) Ions
Pad staining experiments with Cu ions were conducted by adding 50 ppm $CuSO_4 \cdot 5H_2O$ to the slurry prior polishing on a Fujibo $H_{804}$ pad and the mixture was then applied on the pad while polishing a ruthenium (Ru) coupon size of 30 mm×30 mm until the coated ruthenium film is totally removed from the coupon surface. (Ru coupon is diced out of a 200 mm Ru wafer). After polishing, the pad was removed from the polisher and it was dried completely. A circular stain was observed at the pad where the Ru coupon was polished. A small piece of pad was cut and removed for further analysis which was done by using an imaging software. This pad staining experiment resembles accumulation of Ru and Cu debris on pad. Fujibo $H_{804}$ pad was used in these experiments for easier analysis of the stains (species accumulation) on the pad since it is a white pad.
Pad Staining Experiment without Copper (Cu) Ions
For pad staining experiments without Cu ions. Slurry was applied on the pad while polishing a ruthenium coupon until the coated ruthenium film was totally removed from the coupon surface. Then the pad was removed from the polisher and let it dry completely. Pad picture was taken, and picture analysis was done by using an imaging software. For each experiment a fresh pad was used. This experiment resembles the accumulation of Ru debris on the polishing pad.
Results
Pad staining experiments were quantified for comparison of the different slurry compositions. After pad staining experiments were performed, the polishing pad used was taken out from the polisher and then dried at room temperature. The picture of the pad was taken by using a digital camera under defined lightening conditions (the same for all pads) and a defined area of the picture (500×500 pixels) was cropped using a software for gray scale analysis. The software generates a value in between 0 (dark) and 255 (white). For quantitative analysis of pad pictures, mean value for the analyzed pixel area was taken.
A new Fujibo $H_{804}$ (unused) pad was analyzed with the software and its gray value was found to be 156 which refer to the pad cleanness. Therefore, the highest achievable value with the pad staining analysis could be 156. For evaluation of the pad staining results, the cleaner pad surface (free of metal debris) can be obtained if its pad staining value is closer to 156.
Correlation between 200 mm Mirra Mesa and GnP Polisher Pad Staining Results
In order to validate the GnP polisher and establish a correlation between the two polishing platforms 200 mm Mirra Mesa and GnP, a couple of formulations were chosen from the existing results generated on 200 mm polisher and pad staining experiments with these formulations were repeated on GnP polisher as well. FIG. 1 shows the correlation results of GnP ruthenium coupon polishing and 200 mm Mirra Mesa wafer polishing with and without Cu ions. As it is displayed in FIG. 1, there is a reasonable correlation between GnP ruthenium coupon polishing and 200 mm wafer polishing. It can be concluded that the generated pad staining results are independent of the size of the ruthenium wafer/coupon.

TABLE 1

| | Fuso® PL3 | Citric acid | Triton® DF 16 | BTA | Potassium carbonate | Planapur® CP 12 SEG | pH | 200 mm Mirra Mesa Polisher | | | | | Pad Staining with Cu | Pad Staining without Cu |
| | | | | | | | | TEOS RR (A/min) | BD1 RR (A/min) | TaN RR (A/min) | Ru RR (A/min) | Cu RR (A/min) | | |
|---|---|---|---|---|---|---|---|---|---|---|---|---|---|---|
| Ex. 1* | 2.00% | 0.600% | 0.0400% | 0.025% | 0.250% | | 9.25 | 227 | 275 | 549 | 72 | 41 | 131.8 | |
| Ex. 2 | 2.00% | 0.600% | 0.0400% | 0.025% | 0.250% | 0.125% | 9.25 | 308 | 301 | 705 | 102 | 80 | 141.9 | 144.6 |

TABLE 2

| | Fuso® PL3 | Citric acid | Triton® DF 16 | BTA | Potassium carbonate | Planapur® CP 12 SEG | pH | GnP Polisher | | | | | | GnP Polisher | |
| | | | | | | | | TEOS RR (A/min) | BD1 RR (A/min) | BD2 RR (A/min) | TaN RR (A/min) | Ru RR (A/min) | Cu RR (A/min) | Pad Staining with Cu | Pad Staining without Cu |
|---|---|---|---|---|---|---|---|---|---|---|---|---|---|---|---|
| Ex. 1* | 2.00% | 0.600% | 0.0400% | 0.025% | 0.250% | | 9.25 | 231 | 24 | | 547 | 184 | 433 | 132.9 | 139.09 |
| Ex. 2 | 2.00% | 0.600% | 0.0400% | 0.025% | 0.250% | 0.125% | 9.25 | 284 | 36 | | 655 | 199 | 464 | 136.16 | 138.79 |
| Ex. 3* | 2.00% | 0.600% | 0.0400% | 0.025% | 0.250% | | 11.00 | 360 | | 135 | 699 | 291 | 502 | 145.23 | 152.34 |
| Ex. 4 | 2.00% | 0.600% | 0.0400% | 0.025% | 0.250% | 0.125% | 11.00 | 443 | | 157 | 982 | 275 | 666 | 144.38 | 153.14 |
| Ex. 5 | 2.00% | 0.600% | 0.0400% | 0.040% | 0.250% | 0.125% | 11.00 | 459 | | 238 | 1081 | 280 | 354 | 142.32 | 148.32 |

*Not within the scope of the presently claimed invention

Discussion of Results

Tables 1 and 2 shows the material removal rate (MRR) for different substrates and the pad staining with and without copper ions. Addition of Planapur® CP 12 SEG prevented adsorption of ruthenium, copper and ruthenium debris compared to the slurry without these additives at pH of 9.25. Tables 1 and 2 shows the impact of pad-cleaning agent Planapur® CP 12 SEG along with BTA that generates the cleanest pad surface. Table 2 shows the most significant impact of pH in material removal rates.

The CMP compositions of the examples according to the presently claimed invention show improved performance, in terms of ruthenium to copper selectivity, high material removal rates of ruthenium at low abrasive (A) concentration, low material removal rates of the low k material, a low etching behavior and a high dispersion stability. The pad cleaning agent Planapur® CP 12 SEG adsorb to the Cu/Ru debris and make the debris more hydrophilic, which makes the removal of the debris from the polishing environment easier.

The invention claimed is:

1. A method for the manufacture of semiconductor devices comprising the chemical-mechanical polishing of a substrate in the presence of a chemical-mechanical polishing (CMP) composition comprising
    (A) at least one inorganic abrasive particle;
    (B) at least one chelating agent selected from carboxylic acids;
    (C) at least one corrosion inhibitor selected from unsubstituted or substituted triazoles;
    (D) at least one non-ionic surfactant comprising at least one polyoxyalkylene group;
    (E) at least one pad-cleaning agent selected from polymers and co-polymers of acrylic acid, methacrylic acid and maleic acid; wherein the polymers and co-polymers of acrylic acid, methacrylic acid, and maleic acid have a number average molecular weight in the range of ≥500 g/mol to ≤3000 g/mol and wherein the at least one pad-cleaning agent is selected from poly (acrylic acid-co-maleic acid) copolymers;
    (F) at least one carbonate or hydrogen carbonate;
    (G) at least one oxidizing agent selected from the group consisting of organic peroxides, inorganic peroxides, persulfates, iodates, periodic acids, periodates, permanganates, perchloric acids, perchlorates, bromic acids and bromates; and
    (H) an aqueous medium.

2. The method according to claim 1, wherein the at least one inorganic abrasive particle (A) is selected from the group consisting of metal oxides, metal nitrides, metal carbides, silicides, borides, ceramics, diamond, organic hybrid particles, inorganic hybrid particles and silica.

3. The method according to claim 1, wherein the concentration of the at least one inorganic abrasive particle (A) is in the range of from ≥0.01 wt. % to ≤10 wt. %, based on the total weight of the chemical-mechanical polishing composition.

4. The method according to claim 1, wherein the carboxylic acids are selected from the group consisting of dicarboxylic acids and tricarboxylic acids.

5. The method according to claim 1, wherein the concentration of the at least one chelating agent (B) is in the range of from ≥0.001 wt. % to ≤2.5 wt. % based on the total weight of the chemical-mechanical polishing composition.

6. The method according to claim 1, wherein the triazoles are selected from the group consisting of unsubstituted benzotriazoles, substituted benzotriazoles, unsubstituted 1,2,3-triazoles, substituted 1,2,3-triazoles, unsubstituted 1,2,4-triazoles and substituted 1,2,4-triazoles.

7. The method according to claim 1, wherein the concentration of the at least one corrosion-inhibitor (C) is in the range of ≥0.001 wt. % to ≤1 wt. % of the total weight of the chemical-mechanical polishing composition.

8. The method according to claim 1, wherein the concentration of the non-ionic surfactant comprising at least one polyoxyalkylene group (D) is in the range of ≥0.01 wt. % to ≤10 wt. % based on the total weight of the chemical-mechanical polishing composition.

9. The method according to claim 1, wherein the concentration of the pad-cleaning agent (E) is in the range of ≥0.001 wt. % to ≤1 wt. % based on the total weight of the chemical-mechanical polishing composition.

10. The method according to claim 1, wherein the pH of the chemical-mechanical polishing composition is in the range of from 8 to 11.

11. The method according to claim 1, wherein the substrate comprises at least one copper layer and/or at least one ruthenium layer.

12. The method according to claim 1, wherein the substrate comprises
   (i) copper, and/or
   (ii) tantalum, tantalum nitride, titanium, titanium nitride, ruthenium, or ruthenium alloys thereof.

\* \* \* \* \*